United States Patent
Kubo et al.

(10) Patent No.: US 7,440,475 B2
(45) Date of Patent: Oct. 21, 2008

(54) ERROR-CORRECTION MULTIPLEXING APPARATUS, ERROR-CORRECTION DEMULTIPLEXING APPARATUS, OPTICAL TRANSMISSION SYSTEM USING THEM, AND ERROR-CORRECTION MULTIPLEXING TRANSMISSION METHOD

(75) Inventors: Kazuo Kubo, Tokyo (JP); Hideo Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1124 days.

(21) Appl. No.: 10/479,704

(22) PCT Filed: Jun. 12, 2002

(86) PCT No.: PCT/JP02/05859

§ 371 (c)(1),
(2), (4) Date: Dec. 5, 2003

(87) PCT Pub. No.: WO02/103956

PCT Pub. Date: Dec. 27, 2002

(65) Prior Publication Data

US 2004/0170201 A1    Sep. 2, 2004

(30) Foreign Application Priority Data

Jun. 15, 2001  (JP) ............................. 2001-182499
Feb. 26, 2002  (JP) ............................. 2002-050137

(51) Int. Cl.
*H04J 3/02*  (2006.01)
(52) U.S. Cl. ..................... 370/535; 370/476; 714/752; 714/782

(58) Field of Classification Search ................ 370/535, 370/536, 537, 538, 540, 542, 544, 476, 470; 714/752, 753, 758, 746, 781, 782
See application file for complete search history.

(56) References Cited

U.S. PATENT DOCUMENTS 5,392,299 A     2/1995  Rhines et al.
5,546,409 A *   8/1996  Karasawa ................... 714/755

(Continued)

FOREIGN PATENT DOCUMENTS

EP    1 195 935 A1    4/2002

(Continued)

OTHER PUBLICATIONS

O. Ait Sab et al.: ECOC'99 (Sep. 26-30, 1999), Nice, France, pp. II-290 and II-291.

(Continued)

*Primary Examiner*—Min Jung
(74) *Attorney, Agent, or Firm*—Birch, Stewart, Kolasch & Birch, LLP

(57) ABSTRACT

A first demultiplexer and a second demultiplexer receive and demultiplex STM-64 data to generate parallel data. A FEC frame generating encoder carries out error correction encoding operation in a column direction of the parallel data that constitutes a matrix, adds a resulting error correcting code to the parallel data, carries out error correction encoding operation in a row direction of the parallel data, and further adds a resulting error-correcting code to the parallel data. A first multiplexer and a second multiplexer multiplex the error-correction-encoded parallel data, and output the data as a FEC frame.

40 Claims, 23 Drawing Sheets

U.S. PATENT DOCUMENTS

| | | | |
|---|---|---|---|
| 5,666,338 A | | 9/1997 | Ishizawa et al. |
| 6,634,007 B1 * | | 10/2003 | Koetter et al. ............... 714/784 |
| 6,684,367 B1 * | | 1/2004 | Maerkle et al. ............. 714/790 |
| 6,694,476 B1 * | | 2/2004 | Sridharan et al. ........... 714/781 |
| 7,024,616 B2 * | | 4/2006 | Ohira et al. ................. 714/786 |
| 7,093,179 B2 * | | 8/2006 | Shea .......................... 714/755 |
| 2002/0122221 A1 | | 9/2002 | Kubo et al. |
| 2002/0129313 A1 | | 9/2002 | Kubo et al. |
| 2006/0007950 A1 * | | 1/2006 | Okumura et al. ............ 370/441 |
| 2006/0269254 A1 * | | 11/2006 | Arai et al. ................... 386/109 |

FOREIGN PATENT DOCUMENTS

| | | |
|---|---|---|
| GB | 2 275 393 A | 8/1994 |
| JP | 7-202719 A | 8/1995 |
| JP | 9-128890 A | 5/1997 |
| JP | 10-49997 A | 2/1998 |
| JP | 1 030 456 A2 | 8/2000 |
| JP | 2000-307438 A | 11/2000 |
| JP | 2001-332982 A | 11/2001 |
| WO | 01/89134 A1 | 11/2001 |

OTHER PUBLICATIONS

Itu-T Tellecommunication Standardization Sector of ITU, G.975, 17 pages (1996).

* cited by examiner

FIG.4
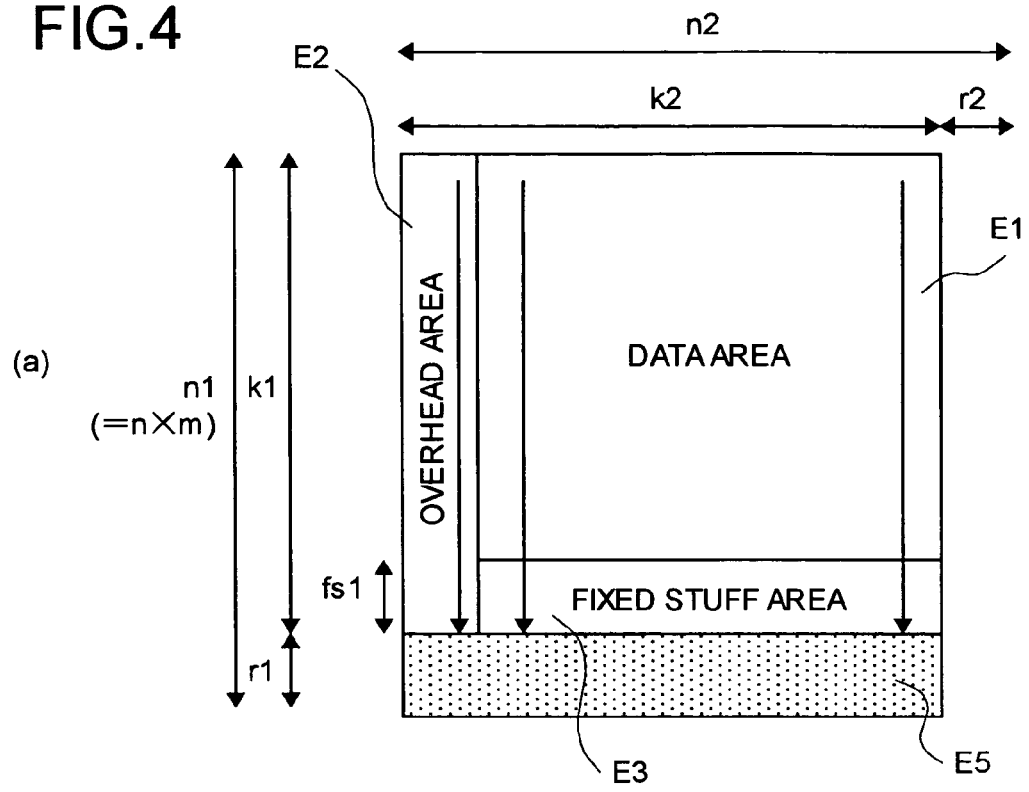
(a)
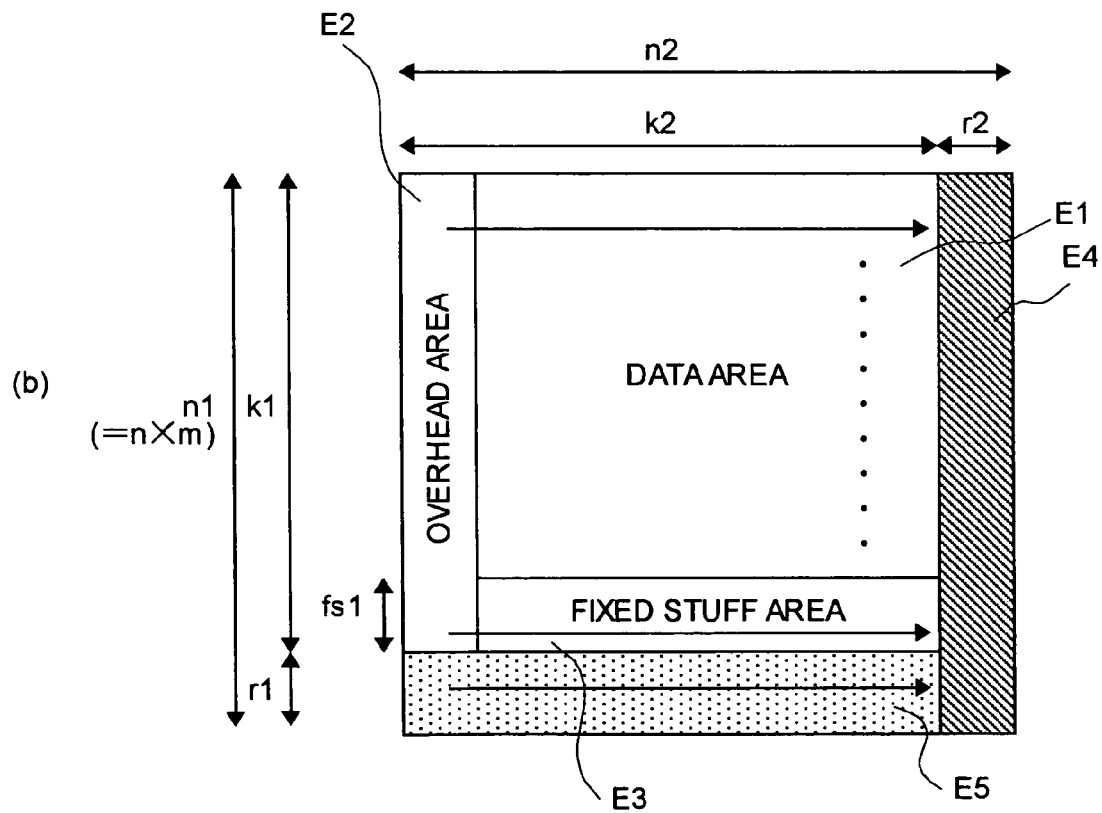
(b)

FIG.19
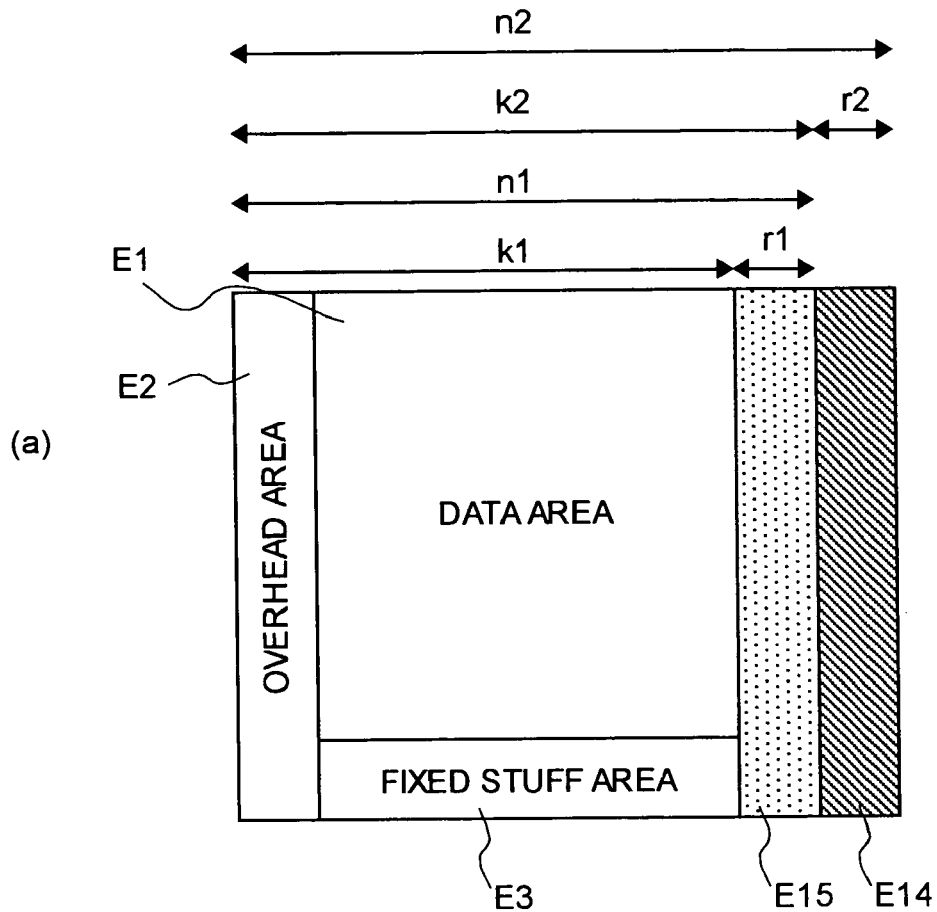
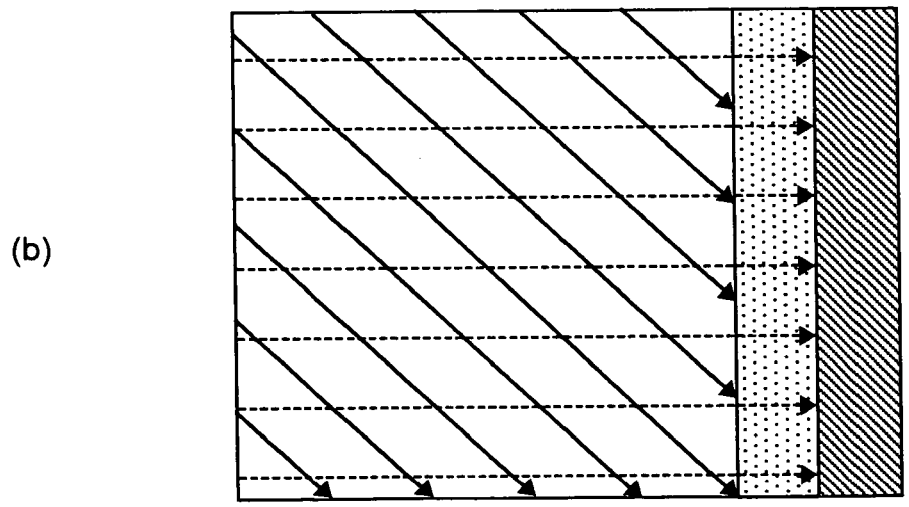

ERROR-CORRECTION MULTIPLEXING APPARATUS, ERROR-CORRECTION DEMULTIPLEXING APPARATUS, OPTICAL TRANSMISSION SYSTEM USING THEM, AND ERROR-CORRECTION MULTIPLEXING TRANSMISSION METHOD

TECHNICAL FIELD

The present invention relates to an error correction multiplexer, an error correction demultiplexer, an optical transmission system employing the error correction multiplexer and the error correction demultiplexer, and a method of error correction multiplexing transmission that corrects bit errors caused by deterioration of signal-to-noise ratio, based on forward error correction (FEC), and to implement long-haul, high-capacity transmission.

BACKGROUND ART

One of the popular optical transmission systems that compensates for deterioration of the optical signal-to-noise ratio based on forward error correction (FEC) is the one recommended by ITU-T G.975. FIG. 22 is a block diagram of an FEC multiplexer at a transmitting end that employs the FEC method recommended by ITU-T G.975. FIG. 23 is a block diagram of an FEC demultiplexer at a receiving end that employs the FEC method.

As shown in FIG. 22, a first demultiplexer 211 receives and demultiplexes an STM-16 data of 2.5 Gbps into 16 parallel data stream of 156 Mbps and outputs the 16 parallel data stream to a second demultiplexer 212. The second demultiplexer 212 receives and further demultiplexes the 16 parallel data stream into 128 parallel data stream of 19 Mbps, and outputs the 128 parallel data stream to a first rate converter 213.

The first rate converter 213 receives the 128 parallel data stream of 19 Mbps and adds a redundant data area to the data stream. The first rate converter 213 then rate-converts the 128 parallel data stream of 19 Mbps into 128 parallel data stream of 21 Mbps and outputs it to an overhead inserting circuit 214. The overhead inserting circuit 214 inserts an overhead (OH) bit such as a frame synchronization data that is necessary for the maintenance and the operation of the optical system, and outputs the overhead (OH) data to an encoder 215.

The encoder 215 carries out error correction encoding by means of Reed Solomon (255,239) codes and outputs the encoded data to a first multiplexer 216. The first multiplexer 216 multiplexes the 128 parallel data stream into 16 parallel data stream of 167 Mbps and outputs the 16 parallel data stream to a second multiplexer 217. The second multiplexer 217 receives the 16 parallel data stream and further multiplexes it to a FEC frame of 2.66 Gbps. The second multiplexer 217 then converts the FEC frame of 2.66 Gbps into an optical signal via an optical transmitter and outputs the optical signal to an optical transmission channel.

The optical signal from the optical transmission channel is converted into an electrical signal by an optical receiver and output the electrical signal to a third demultiplexer 221. The third demultiplexer 221 receives and demultiplexes the FEC frame of 2.66 Gbps into 16 parallel data stream of 167 Mbps, and outputs the 16 parallel data stream of 167 Mbps to a fourth demultiplexer 222. The fourth demultiplexing 222 receives the 16 parallel data stream, further demultiplexes it into the 128 parallel data stream of 21 Mbps, and outputs the 128 parallel data stream of 21 Mbps to a frame synchronization circuit 223.

The frame synchronization circuit 223 detects the header position of the FEC frame based on the frame synchronization data included in an overhead data area and outputs frame-synchronized data to a decoder 224. The decoder 224 detects and corrects bit errors by means of the Reed Solomon (255, 239) codes and outputs the corrected data to an overhead separating circuit 225.

The overhead separating circuit 225 separates the overhead data area. A second rate converter 226 removes the redundant data area in which the error correction codes are stored, converts the remaining data into the 128 parallel data stream of 19 Mbps, and outputs it to a third multiplexer 227. The third multiplexer 227 receives and multiplexes the 128 parallel data stream of 19 Mbps to the 16 parallel data stream of 156 Mbps, and outputs the 16 parallel data stream of 156 Mbps to a fourth multiplexer 228. The fourth multiplexer 228 receives and multiplexes the 16 parallel data stream of 156 Mbps and outputs it as the STM-16 data stream of 2.5 Gbps.

The FEC frame is composed of subframes 1 through 128 that include one column of the overhead bit, 238 columns of the STM-16 data, and 16 columns of a Reed Solomon (255, 239) redundant data. The error correction encoding is carried out after every eighth subframe.

For instance, in the subframes 1 through 8, the error correction encoding is carried out for the overhead bit and the STM-16 data, and the Reed Solomon (255,239) redundant data is stored in columns R0-0 through R0-15. As shown in FIG. 24B, the FEC frame is generated sequentially multiplexing the subframes 1 through 128. If we assume that the Reed Solomon (255,239) codes 0 through 15 are multiplexed for 'f' number of times, then FIG. 24 shows an example when f=16.

The transmission rate in the FEC frame increases 15/14 times with respect to the original rate of the STM-16. Hence, the transmission rate of the FEC frame becomes 2.66 Gbps. In this way, the bit errors can be corrected by adding the FEC frame and a high quality service can be offered in an optical transmission system. Hence, an optical transmission system that facilitates transmission of high capacity of signals over long distances can be built.

When a Reed Solomon (127,111) encoding that has reduced error correction codes is carried out on the Reed Solomon (255,239) codes by, for instance, reducing the STM-16 data of the subframes from 238 columns to 110 columns, the percentage of the redundant data corresponding to the data increases and the error correction capability can be improved.

However, in the optical transmission system described above, when the transmission distance is increased or the number of wavelengths is increased using a wavelength multiplexing system, deterioration of the signal-to noise ratio is considerable. A conventional way to prevent the deterioration of the signal-to noise ratio is to reduce the error correction codes to improve the constant error correction capability. However, when the error correction codes are reduced, the percentage of the redundant data with respect to the data that is supposed to be transmitted increases, resulting in an increase in the transmission rate. Thus, an optical transmission system that maintains a certain quality and facilitates transmission of high capacity of signals over a long distance cannot be built.

For instance, in the Reed Solomon (127,111) encoding, the transmission rate of the FEC frame becomes 127/111 times to 2.89 Gbps with respect to the rate of 2.5 Gbps of the STM-16 data, resulting in more deterioration of the optical transmission characteristics. As a result, even if the code length is reduced, an optical transmission system that maintains a certain quality and facilitates transmission of high capacity of signals over a long distance cannot be built.

DISCLOSURE OF THE INVENTION

It is an object of the present invention to solve at least the problems in the conventional technology.

The error correction multiplexer according to one aspect of the present invention includes a demultiplexer that demultiplexes first serial data stream into parallel data stream constituting a matrix, a first encoder that calculates a first error correcting code from data in a first direction of the matrix, and adds the first error correcting code to the parallel data stream, a second encoder that calculates a second error correcting code from data in a second direction of the matrix, and adds the second error correcting code to the parallel data stream, and a multiplexer that multiplexes the parallel data stream that is error-correction-coded based on the first error correcting code and the second error correcting code into second serial data stream, and outputs the second serial data stream.

The error correction demultiplexer according to another aspect of the present invention includes a demultiplexer that demultiplexes first serial data stream into first parallel data stream, a decoder that decodes the first parallel data stream into third parallel data stream based on the error correcting codes, and a multiplexer that multiplexes the third parallel data stream into second serial data stream, and outputs the second serial data stream. The first serial data stream is multiplexed with a plurality of error correcting codes, and each error correcting code is calculated from data in different direction of a matrix formed by second parallel data stream.

The optical transmission system according to still another aspect of the present invention includes a first optical receiver that converts first optical signals into electrical signals to generate first serial data stream, an error correction multiplexer, a first optical transmitter that converts the second serial data stream into second optical signals, an optical transmission line to transmit the second optical signals, a second optical receiver that converts the second optical signals input through the optical transmission line into electrical signals to generate third serial data stream, an error correction demultiplexer, and a second optical transmitter that converts the fourth serial data stream into third optical signals. The error correction multiplexer includes a first demultiplexer that demultiplexes the first serial data stream into first parallel data stream constituting a matrix, a first encoder that calculates a first error correcting code from data in a first direction of the matrix, and adds the first error correcting code to the first parallel data stream, a second encoder that calculates a second error correcting code from data in a second direction of the matrix, and adds the second error correcting code to the first parallel data stream, and a first multiplexer that multiplexes the first parallel data stream that is error-correction-coded based on the first error correcting code and the second error correcting code into second serial data stream, and outputs the second serial data stream. The error correction demultiplexer includes a second demultiplexer that demultiplexes the third serial data stream into second parallel data stream, a decoder that decodes the second parallel data stream into third parallel data stream based on the error correcting codes, and a second multiplexer that multiplexes the third parallel data stream into fourth serial data stream, and outputs the fourth serial data stream; and The method of error correction multiplexing transmission according to still another aspect of the present invention includes demultiplexing first serial data stream into first parallel data stream constituting a matrix, calculating a first error correcting code from data in a first direction of the matrix, adding the first error correcting code to the first parallel data stream, calculating a second error correcting code from data in a second direction of the matrix, adding the second error correcting code to the first parallel data stream, and multiplexing the first parallel data stream into second serial data stream.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 4(a) and (b) illustrate a process of error correction encoding by means of the FEC multiplexer shown in FIG. 2;

FIG. 19(a) and (b) illustrate a process of error correction encoding by means of the FEC multiplexer shown in FIG. 17;

BEST MODE FOR CARRYING OUT THE INVENTION

An error correction multiplexer, an error correction demultiplexer, an optical transmission system employing the error correction multiplexer and demultiplexer, and a method of error correction multiplexing transmission are explained in detail with reference to the accompanying drawings.

Figure 1:
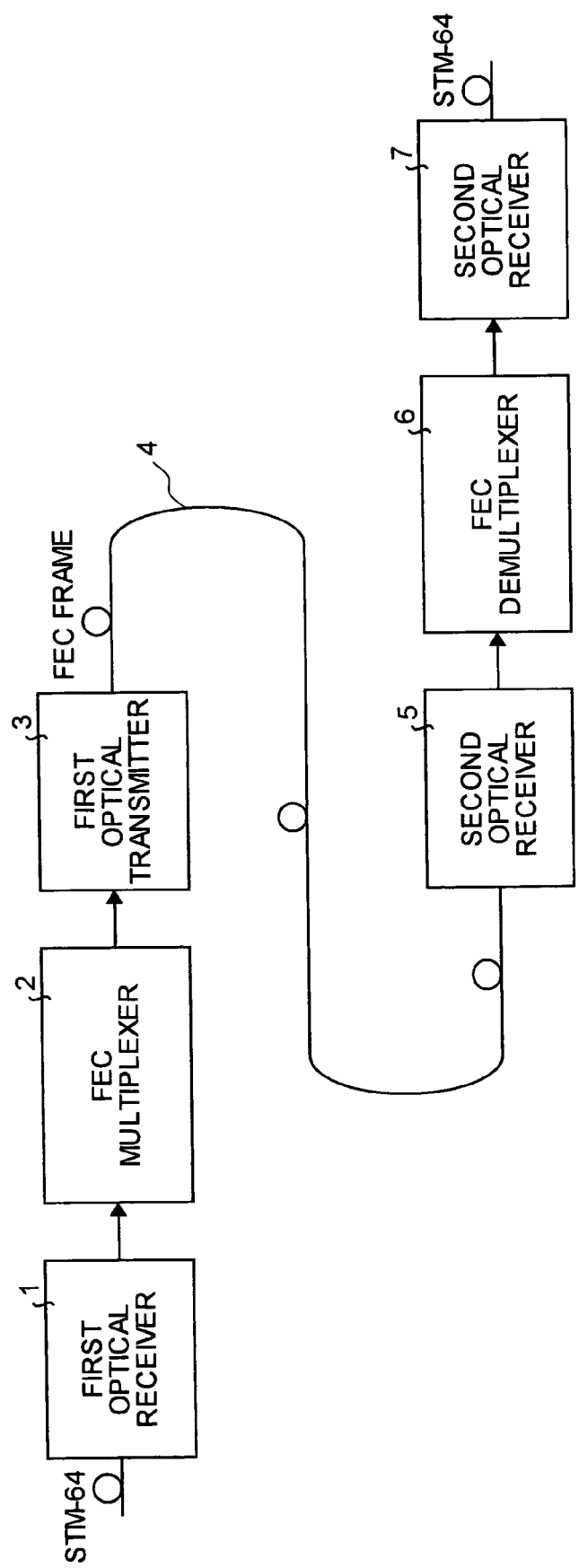
FIG. 1 is a block diagram of an optical transmission system according to a first embodiment of the present invention.

FIG. 1 is a block diagram of the optical transmission system according to a first embodiment of the present invention. In this optical transmission system, a first optical receiver 1 receives a STM-64 optical signal, converts the optical signal into an electrical signal, and outputs the electrical signal to a FEC multiplexer 2.

The FEC multiplexer 2 multiplexes the electrical signal received from the first optical receiver 1, inserts an overhead (OH) bit, calculates and generates error-correcting codes, etc., multiplexes the error-correcting codes, creates a FEC frame that includes the multiplexed error-correcting codes, and outputs the FEC frame to a first optical transmitter 3. The first optical transmitter 3 converts the electric signal of the FEC frame received from the FEC multiplexer 2 into an optical signal and outputs this optical signal to an optical transmission channel 4 that comprises optical fibers.

A second optical receiver 5 receives the optical signal from the optical transmission channel 4, converts the optical signal to an electrical signal, and outputs the electrical signal to a FEC demultiplexer 6. The FEC demultiplexer 6 receives the FEC frame, determines the frame synchronization of the FEC frame, decodes the error-correcting codes based on the added error-correcting codes, separates the added overhead bit, again multiplexes the electrical signal, and outputs the multiplexed electrical signal to a second optical receiver 7. The second optical receiver 7 receives and converts the electrical signal into an optical signal, and outputs the converted optical signal as the STM-64 optical signal.

Transmitting a large amount of optical signals over long distances may give rise to deterioration of signal-to-noise ratio in the optical transmission channel 4 and cause numerous bit errors in the FEC frame output from the second optical receiver 5. These bit errors are corrected by the FEC demultiplexer 6. Consequently, the bit error rate of the STM-64 optical signal can be considerably improved and a transmission service of a prescribed quality can be maintained.

Figure 2:
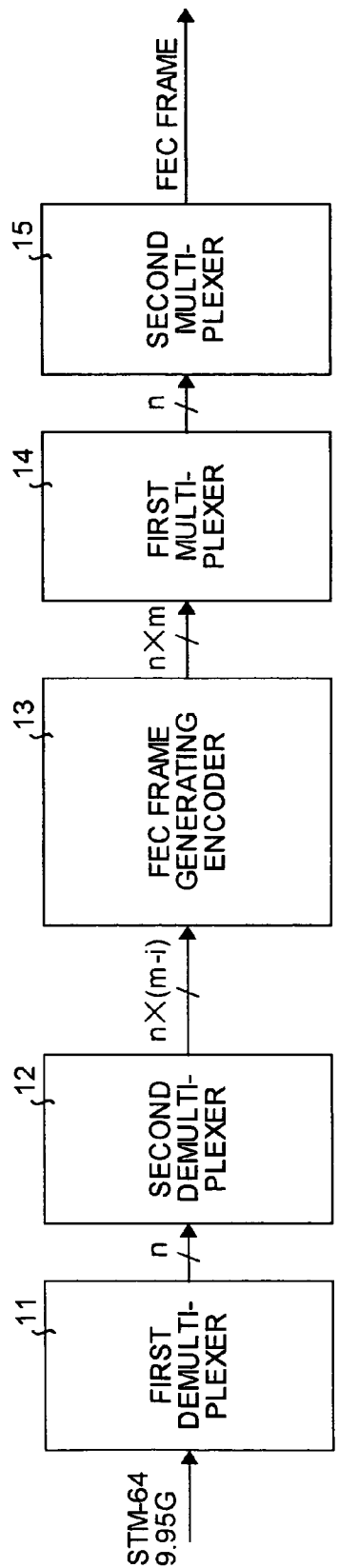
FIG. 2 is a block diagram of the FEC multiplexer shown in FIG. 1.

FIG. 2 is a block diagram of the FEC multiplexer 2 shown in FIG. 1. A first demultiplexer 11 receives the STM-64 (of 9.95 Gbps) electrical signal, which is a serial data stream, from the first optical receiver 1, demultiplexes the serial data stream into n parallel data stream(where n is positive integer), and outputs the n parallel data stream to a second demultiplexer 12.

The second demultiplexer 12 receives the n parallel data stream, demultiplexes them into (n×(m−i)) parallel data stream (where m and i are positive integers and m is greater than i), and outputs the (n×(m−i)) parallel data stream to a FEC frame generating encoder 13.

The FEC frame generating encoder 13 receives the (n×(m−i)) parallel data stream, creates (n×m) parallel data stream by storing the overhead bit, creating a redundant data area, and storing in the redundant data area the error-correcting codes generated by error correction encoding. The FEC frame generating encoder then outputs the (n×m) parallel data stream to a first multiplexer 14.

The first multiplexer 14 receives the (n×m) parallel data stream, multiplexes them into n parallel data stream, and outputs the n parallel data stream to a second multiplexer 15. The second multiplexer 15 receives the n parallel data stream, multiplexes and converts it into a serial data stream, and outputs this serial data stream as a FEC frame to the first optical transmitter 3.

Figure 3:
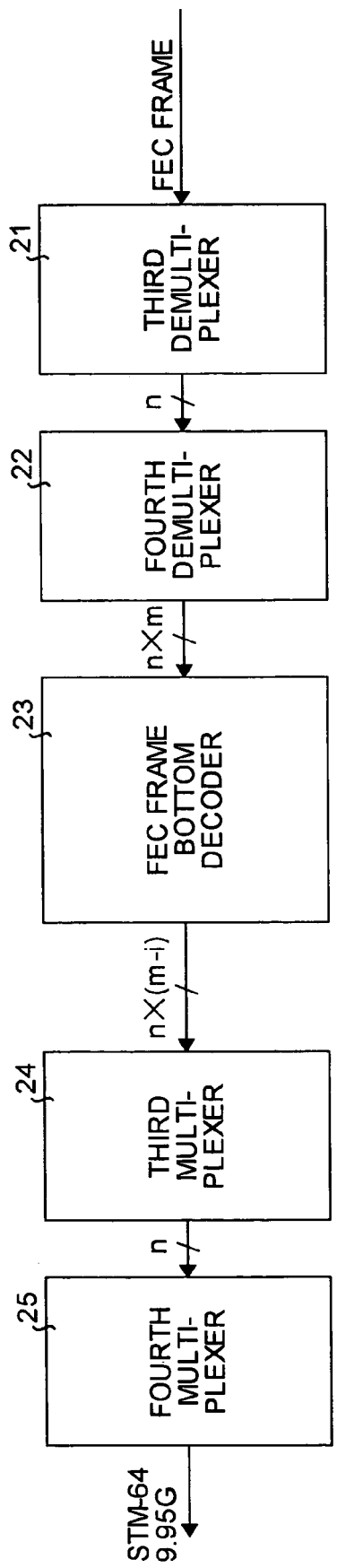
FIG. 3 is a block diagram of the FEC demultiplexer shown in FIG. 1.

FIG. 3 is a block diagram of the FEC demultiplexer 6 shown in FIG. 1. A third demultiplexer 21 receives the FEC frame from the second optical transmitter 5, demultiplexes it into n parallel data stream, and outputs the n parallel data stream to a fourth demultiplexer 22. The fourth demultiplexer 22 receives the n parallel data stream, demultiplexes the n parallel data stream into (n×m) parallel data stream, and outputs the (n×m) parallel data stream to a FEC frame bottom decoder 23.

The FEC frame bottom decoder 23 receives the (n×m) parallel data stream from the fourth demultiplexer 22, determines the frame synchronization, carries out processes such as overhead bit extraction, error decoding based on error encoding, etc., finally creates (n×(m−i)) parallel data stream, and outputs the (n×(m−i)) parallel data stream to a third multiplexer 24. The third multiplexer 24 receives the (n×(m−i)) parallel data stream, multiplexes and converts it into n parallel data stream,and outputs it to a fourth multiplexer 25. The fourth multiplexer 25 receives the n parallel data stream, multiplexes and converts it into a serial data stream, and outputs the serial data stream as a STM-64 serial data stream (electrical signal) to the second optical receiver 7.

FIG. 4(a) and (b) are schematic diagrams that illustrate the error correction encoding process of the FEC frame generating encoder 13 shown in FIG. 2. The STM-64 data is stored in a data area E1. An overhead data area E2 is disposed in the column before the data area E1. Overhead information related to maintenance and operation of the network, of which the optical transmission system is a part, is stored in the overhead data area E2. A fixed stuff area E3 is provided for absorbing the difference between code length of the (n×(m−i)) parallel data stream and the code length n1 in the direction of the column. The data area E1, the overhead data area 2, and the fixed stuff area E3 form a matrix of k2×k1.

An error-correcting code in the column direction and having a code length n1, a data length k1, and a redundant bit length r1, is placed in the row direction k2 in a redundant data area E5 (FIG. 4(a)). Following the placing of the error-correcting code in the redundant data area E5, an error-correcting code in the row direction and having a code length n2, a data length k2, and a redundant bit length r2, is placed in the column direction n1. in redundant data area E4 (FIG. 4(b)). As n×m=n1, the width fs1 of the fixed stuff area E3 in the column direction is determined by the expression fs1=n×i−r1, where n1, n2, k1, k2, r1, r2, and fs1 are all positive integers.

In other words, the error-correcting codes placed in the redundant data areas E4 and E5 are processed in directions that are mutually orthogonal and each error-correcting code is independent of the other. As a result, an error correction in the column direction can be carried out using the error correction result in the row direction. Similarly, an error correction in the row direction can be carried out using the error correction result in the column direction. In this way, a superior error correction capability can be achieved.

Figure 5:
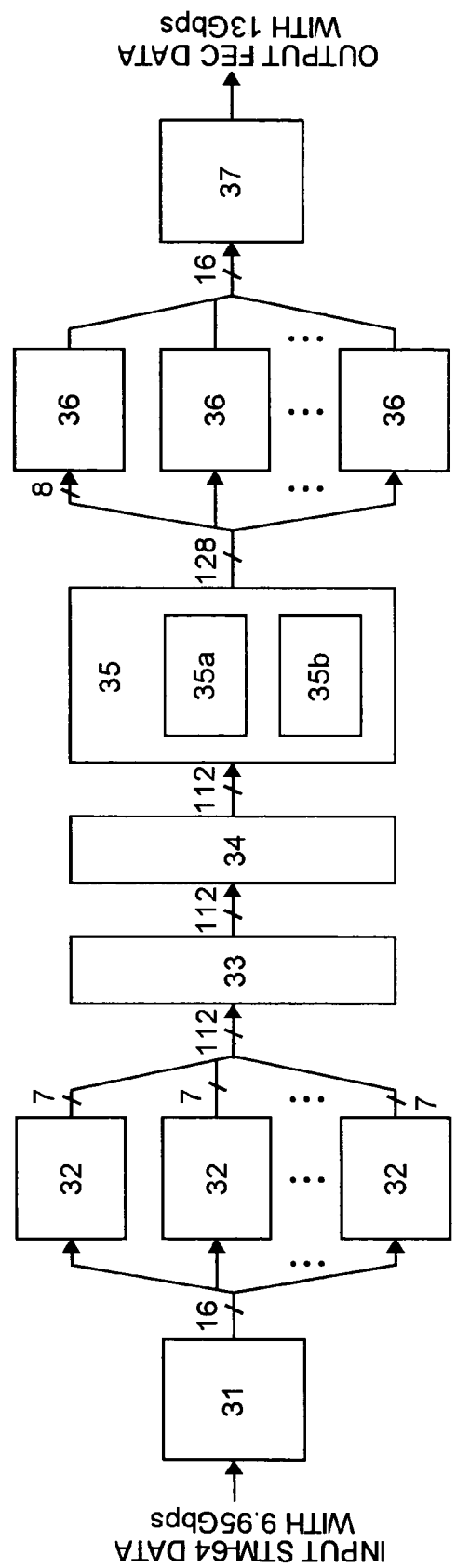
FIG. 5 is a detailed block diagram of the FEC multiplexer shown in FIG. 1.
Figure 6:
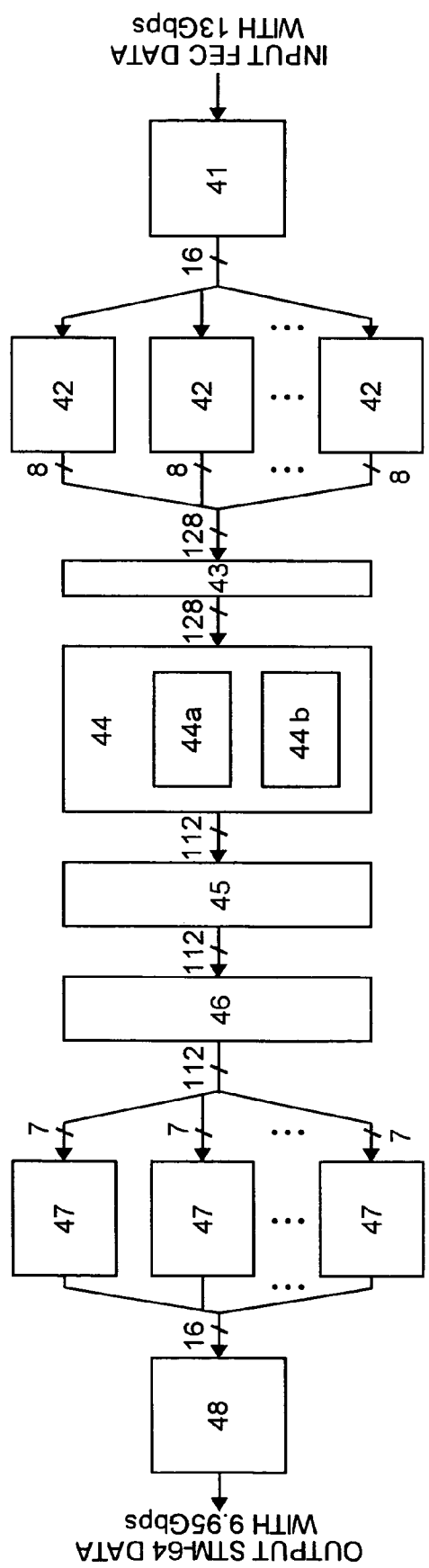
FIG. 6 is a detailed block diagram of the FEC demultiplexer shown in FIG. 1.

The structures of the FEC multiplexer 2 and the FEC demultiplexer 6 are explained in detail next. FIG. 5 is a detailed block diagram of the FEC multiplexer 2 shown in FIG. 1. FIG. 6 is a detailed block diagram of the FEC demultiplexer 6 shown in FIG. 1. Here, the error-correcting codes stored in the redundant data areas E4 and E5 are BCH signals of values BCH(128,113). Consequently, n1=n2=128, k1=k2=113, r1=r2=15, and fs1=1.

In FIG. 5, a first 1 to 16 serial-parallel converter 31 demultiplexes a STM-64 serial data stream (of 9.95 Gbps) into 16 parallel data stream of 622 Mbps and outputs each 16 parallel data stream to a corresponding 1 to 7 serial-parallel converter 32 placed next. There are sixteen 1 to 7 serial-parallel converters 32 arranged in a parallel fashion. Each of the sixteen 1 to 7 serial-parallel converters 32 demultiplexes the received 16 parallel data stream into 7 parallel data stream, collectively generates 112 parallel data stream of 89 Mbps, and outputs the 112 parallel data stream to a first rate converter 33.

The first rate converter 33 receives the 112 parallel data stream of 89 Mbps, adds to the 112 parallel data stream the overhead data area E2 and the redundant data area E4, and outputs the 112 parallel data stream to a overhead inserting circuit 34 as 112 parallel data stream of 102 Mbps. The overhead inserting circuit 34 inserts in the overhead data area E2 overhead bit such as frame synchronization data, etc., required for the maintenance and operation of the optical transmitting system and outputs the 112 parallel data stream to an encoder 35.

The encoder 35 includes a first encoder 35a and a second encoder 35b. The first encoder 35a receives the 112 parallel data stream, calculates the error-correcting code for the column direction in the entire row direction k2 of 113 parallel data stream, which is obtained by adding to the 112 parallel data stream the fixed stuff area E3 (which has a width fs1 of one line in the column direction) in which dummy bits are stored. The first encoder 35a then adds the redundant data area E5 to the 113 parallel data stream and stores the error-correcting code in the redundant data-area E5. The second encoder 35b calculates the error-correcting code for the row direction in the width r1=15 in the row direction of the redundant data area E5. In other words, the second encoder 35b calculates the error-correcting code in the row direction of the 128 parallel data stream which has been increased by 15. The second encoder 35b then stores the error-correcting code in the redundant data area E4. Following this, the encoder 35 splits the 128 parallel data stream into 16 and outputs each of the 16 parallel data stream to a corresponding 8 to 1 parallel-serial converter 36 placed next. There are sixteen 8 to 1 parallel-serial converters 36 arranged in a parallel fashion.

Each 8 to 1 parallel-serial converter 36 multiplexes the received 128 parallel data stream of 102 Mbps. The multiplexed 128 parallel data stream of 102 Mbps output from each of the sixteen 8 to 1 parallel-serial converter are collectively output as 16 parallel data stream of 812 Mbps to a first 16 to 1 parallel-serial converter 37 placed next. The first 16 to 1 parallel-serial converter 37 multiplexes and converts the received 16 parallel data stream into a FEC frame, which is a serial data stream of 13 Gbps and outputs the serial data stream to the first optical transmitter 3.

The functioning of the FEC multiplexer shown in FIG. 5 is explained next. The 112 parallel data stream of 89 Mbps output from the sixteen parallel 1 to 7 serial-parallel converters 32 is data that is stored in the data area E1. To this 112 parallel data stream, the overhead data area E2 and the redundant data area E4 are added by the first rate converter 33 following which the data becomes 112 parallel data stream of 102 Mbps. After the overhead bits are stored in the overhead data area E2 of this 112 parallel data stream, the encoder 35 carries out BCH(128,113) encoding for the column direction of the 113 parallel data stream, which is obtained by forming the fixed stuff area E3 of width fs1 of one line in the column direction) to which dummy data is added in order to align the code length. The encoder 35 then adds the redundant data area E5, stores the error-correcting code in the redundant data area E5, and creates 128 parallel data stream. Following this, the encoder 35 carries out BCH(128,113) encoding in the row direction, and stores the error-correcting code in the redundant data area E4, creating 128 parallel data stream of 102 Mbps.

The transmission rate of the final FEC frame of a STM-64 data of 9.95 Gbps increases to 13 Gbps due to the addition of the redundant data areas E4 and E5 and the resultant 128/112)×(128/112)-times increase in the row direction and the column direction.

Consequently, the FEC multiplexer creates a FEC frame with k2 BCH codes calculated in the column direction and n1 BCH codes calculated in the row direction. As a result, the error correction capability of the FEC multiplexer can be considerably enhanced. Further, the second demultiplexer 12 shown in FIG. 2 comprises sixteen 1 to 7 serial-parallel converters 32 arranged in a parallel fashion and adds the redundant data area E4 to the data stream. Consequently, the redundant data area E4 is easily added even to a high rate data, thereby simplifying the overall circuitry.

In FIG. 6, a second 1 to 16 serial-parallel converter 41 receives the FEC frame from the second optical receiver 5 and demultiplexes the FEC frame of 13 Gbps into 16 parallel data stream of 812 Mbps. Each of the 16 parallel data stream is split into 16. Each of the 16 data stream is output to a corresponding 1 to 8 serial-parallel converter 42 placed next. There are sixteen 1 to 8 serial-parallel converters 42 arranged in a parallel fashion. Each 1 to 8 serial-parallel converter 42 further demultiplexes the received data stream into 8 parallel data stream, collectively generates 128 parallel data stream of 102 Mbps, and outputs the 128 parallel data stream to a frame synchronization circuit 43.

The frame synchronization circuit 43 checks the frame synchronization pattern from the overhead data area E2 of the received 128 parallel data stream, detects the header position of the frame created by the received 128 parallel data stream, and outputs a frame-synchronized 128 parallel data stream to a decoder 44. The decoder 44 includes a first decoder 44a and a second decoder 44b. The first decoder 44a carries out error correction in the row direction based on the error-correcting code stored in the redundant data area E4. The second decoder 44b carries out error correction in the column direction based on the error-correcting code stored in the redundant data area E5, and outputs to an overhead separating circuit 45 112 parallel data stream of 102 Mbps from which the redundant data area E5 has been removed. The overhead separating circuit 45 removes the overhead bit stored in the overhead data area E2 and outputs to a second rate converter 46 the 112 parallel data stream of 102 Mbps from which the overhead bit has been removed.

The second rate converter 46 removes the overhead data area E2 and the redundant data area E4 from the received 112 parallel data stream and converts it into 112 parallel data stream of 89 Mbps. The second rate converter 46 then outputs the 112 parallel data stream as 7 parallel data stream to each of sixteen 7 to 1 parallel-serial converters 47 arranged next in a parallel fashion. Each of the sixteen 7 to 1 parallel-serial converters 47 then multiplexes the received 7 parallel data stream, collectively generates 16 parallel data stream of 622 Mbps, and outputs the 16 parallel data stream to a second 16 to 1 parallel-serial converter 48. The second 16 to 1 parallel-serial converter 48 multiplexes and converts the received 16 parallel data stream into a STM-64 data of 9.95 Gbps and outputs the STM-64 data to the second optical receiver 7.

The functioning of the FEC demultiplexer 6 is explained next. Based on the error-correcting code in the row direction stored in the redundant data area E4, the first decoder 44a decodes each row of the 128 parallel data stream of 102 Mbps and corrects the bit error. However, when the bit errors exceed the error correction capability, some bit errors remain uncorrected. Here, the second decoder 44b also corrects, based on the error-correcting code in the column direction stored in the redundant data area E5, the bit errors remaining in the row direction. Consequently, as the bit errors are distributed between the row directional error-correcting code and the column directional error-correcting code of the FEC frame, a superior error correction capability can be achieved.

In the encoder 35, error correction encoding in the column direction and the row direction can be achieved by providing an interleaver between the first encoder 35a and the second encoder 35b.

The interleaver can be implemented by means of an X-Y converting circuit. The interleaver in the first embodiment of the present invention is included in the second encoder 35b. Similarly, in the decoder 44 as well, error correction encoding in the column direction and the row direction can be achieved by providing an interleaver between the first decoder 44a and the second decoder 44b, and a deinterleaver at the output end of the second decoder 44b. Again, both the interleaver and the deinterleaver are implemented by means of an X-Y converting circuit. The interleaver and the deinterleaver in the first embodiment of the present invention are included in the second decoder 44b.

In the first embodiment of the present invention, during the error correction encoding, the error correction encoding in the row direction follows the error correction encoding in the column direction, and during error correction decoding, the error correction decoding in the column direction follows the error correction decoding in the row direction. However, this is not a hard and fast rule and the sequence of error correction encoding and decoding may be reversed. That is, during the error correction encoding, the error correction encoding in the row direction may be carried out before the error correction encoding in the column direction. Similarly, during the error correction decoding, the error correction decoding in the column direction may be carried out before the error correction decoding in the row direction. In short, when creating the FEC frame, a two-stage error correction encoding and a two-stage error correction decoding in directions that are mutually orthogonal may be carried out so that bit errors may be distributed between the error-correcting codes.

Further, in the first embodiment of the present invention, during the error correction encoding in the row direction, error correction encoding for the error-correcting code in the column direction, for which the error correction encoding has been done once, is carried out again. This again is not a hard and fast rule. That is, during the error correction encoding in the column direction, the error correction encoding for the error-correcting code in the row direction, for which error correction encoding has been done once, may be carried out again. However, error correction in the row direction occurs when error correction encoding in the row direction is carried out while error correction encoding in the column direction is taking place. As a result, the error correction encoding of a higher accuracy can be carried out.

According to the first embodiment of the present invention, the redundant data area E4, in which the error-correcting code obtained by error correction encoding in the row direction of (n×(m−i)) parallel data stream are stored, is added by the second demultiplexer 12. Besides, the (n×(m−i)) parallel data stream is multiplexed into n parallel data stream by the third multiplexer 24. Fast conversion therefore is achieved with such a simple structure. In addition, in the present embodiment, a superior error correction capability is achieved as the bit errors that remain uncorrected following a first error correction are reliably corrected. Hence, an optical transmission system with enhanced error correction capability and in which transmission of a large amount of signals over long distances can be achieved.

Second Embodiment

A second embodiment of the present invention is explained next. In the second embodiment, a soft decision decoding process has been implemented on the device at the receiver (decoding) end.

Figure 7:
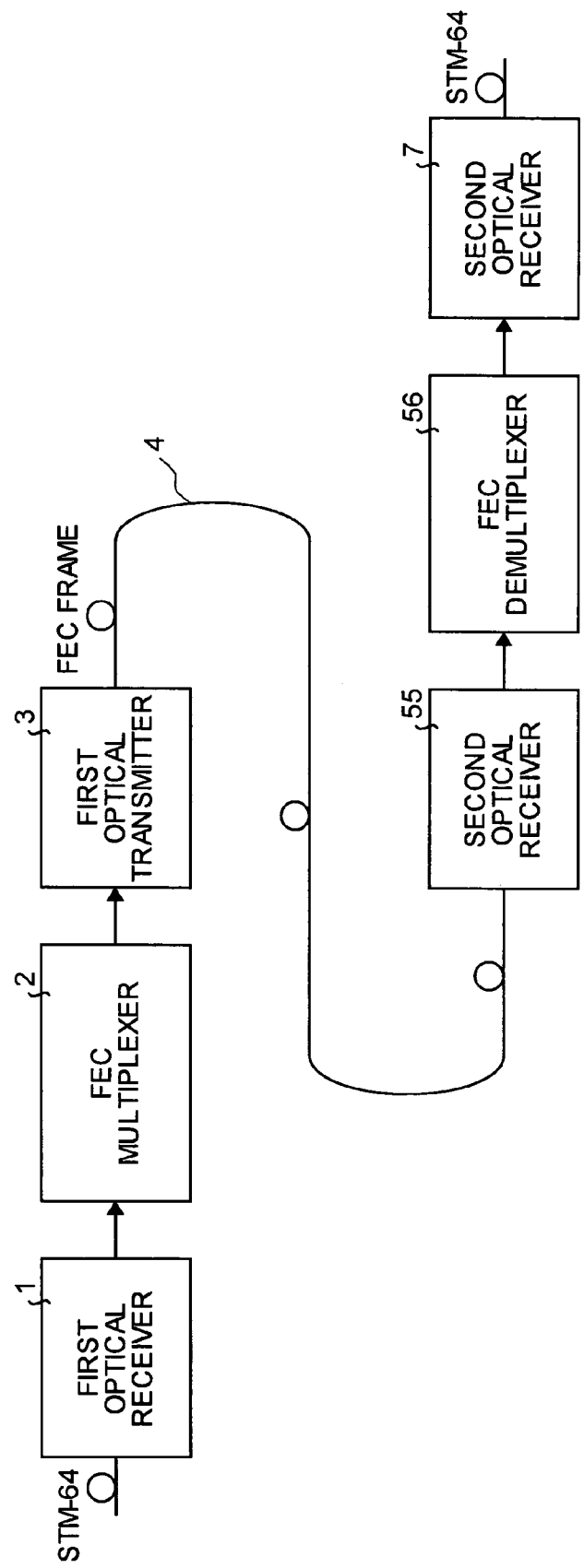
FIG. 7 is a block diagram of an optical transmission system according to a second embodiment of the present invention.

FIG. 7 illustrates the overall structure of the optical transmission system according to the second embodiment of the present invention. This optical transmission system includes, instead of the second optical receiver 5 and the FEC demultiplexer 6 of the optical transmission system shown in FIG. 1, a second optical receiver 55 and a FEC demultiplexer 56, respectively. The rest of the structure shown in FIG. 1 and FIG. 7 is identical and identical parts in the two drawings are assigned identical reference numerals. The second optical receiver 55, as well as converting optical signals received from an optical transmission channel 4 into electrical signals, carries out a soft decision process on the electrical signals, quantizes the binary data into j bits (where j is a positive integer of 2 or greater), and outputs a FEC frame as 3 parallel data stream of 13 Gbps to the FEC demultiplexer 56. The FEC demultiplexer 56 carries out a soft decision decoding based on the 3 parallel data stream.

Figure 8:
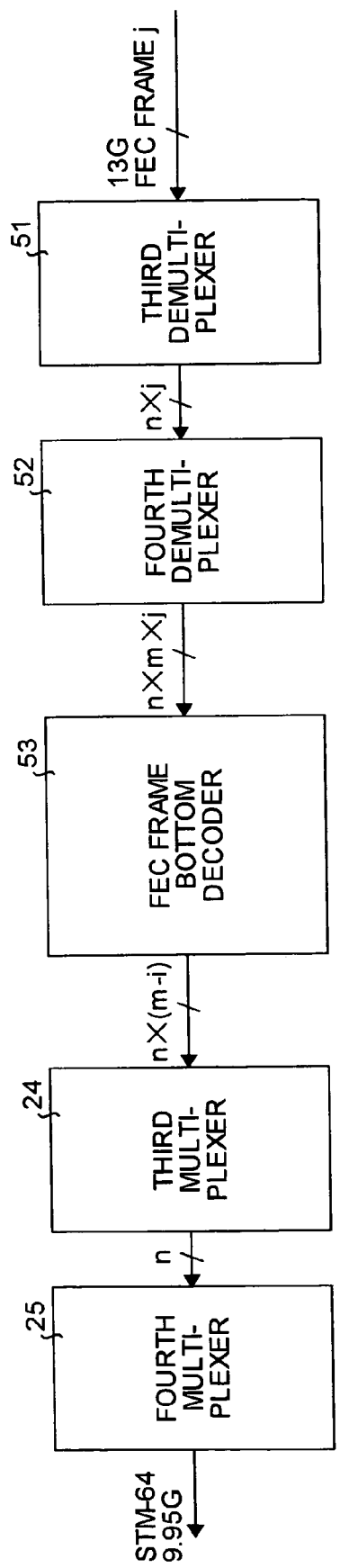
FIG. 8 is a block diagram of the FEC demultiplexer shown in FIG. 7.

FIG. 8 is a detailed block diagram of the FEC demultiplexer 56 shown in FIG. 7. The FEC demultiplexer 56 includes, instead of the third demultiplexer 21, the fourth demultiplexer 22, and the FEC frame bottom decoder 23 of the FEC demultiplexer 6 shown in FIG. 3, a third demultiplexer 51, a fourth demultiplexer 52, and a FEC frame bottom decoder 53, respectively. The rest of the structure shown in FIG. 3 and FIG. 8 is identical and identical parts in the two drawings are assigned identical reference numerals.

In FIG. 8, the third demultiplexer 51 demultiplexes the j parallel data stream of 13 Gbps output from the second optical receiver 55 into (n×j) parallel data stream and outputs the (n×j) parallel data stream to the fourth demultiplexer 52. The fourth demultiplexer 52 demultiplexes the received (n×j) parallel data stream into (n×m×j) parallel data stream and outputs the (n×m×j) parallel data stream to the FEC frame bottom decoder 53. The FEC frame bottom decoder 53 carries out a soft decision decoding process based on the received (n×m×j) parallel data stream and outputs a decoded (n×(m−i)) parallel data stream.

Figure 9:
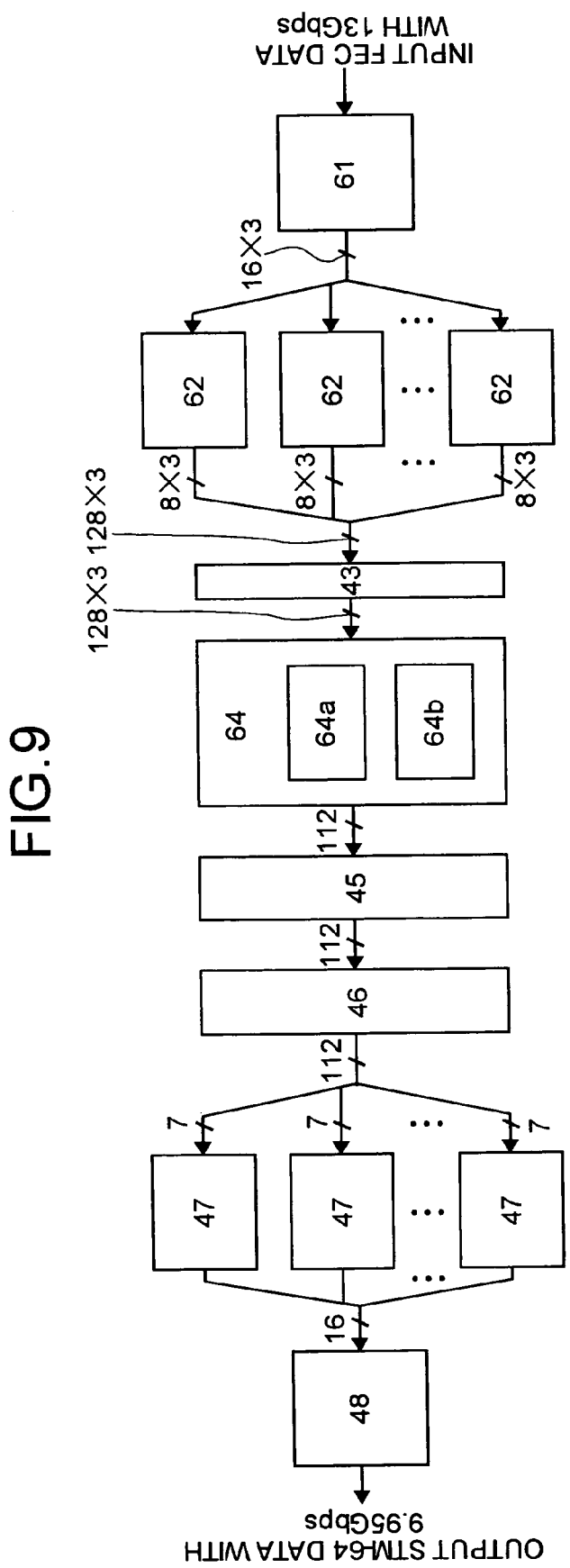
FIG. 9 is a detailed block diagram of the FEC demultiplexer shown in FIG. 7.

The FEC demultiplexer 56 shown in FIG. 8 is explained next with reference to the detailed block diagram shown in FIG. 9. The FEC demultiplexer 56 includes, instead of the second 1 to 16 serial-parallel converter 41, the 1 to 8 serial-parallel converter 42, and the encoder 44 of the FEC multiplexer shown in FIG. 6, a (1 to 16)×3 serial-parallel converter 61, a (1 to 8)×3 serial-parallel converter 62, and an encoder 64, respectively. The rest of the structure in FIG. 6 and FIG. 9 is identical and identical parts in the two drawings are assigned identical reference numerals.

The (1 to 16)×3 serial-parallel converter 61 demultiplexes the received 3 parallel data stream of 812 Mbps into 48 (16×3) parallel data stream of 812 Mbps, splits this 48 parallel data stream into 3 streams, and outputs each of the 3 parallel data stream to a corresponding (1 to 8)×3 serial-parallel converter 62 placed next. There are sixteen (1 to 8)×3 serial-parallel converters 62 arranged in a parallel fashion. Each (1 to 8)×3 serial-parallel converter 62 demultiplexes the 24 ((8×3)) parallel data stream, collectively generates a 348 ((128×3)), and outputs the 384 parallel data stream of 102 Mbps to a frame synchronization circuit 43. The frame synchronization circuit 43 checks the frame synchronization pattern from the overhead bit, detects the header position of the frame of the FEC frame, and outputs the frame-synchronized 384 parallel data stream to the decoder 64.

The decoder 64 carries out the soft decision decoding of the 384 parallel data stream of 102 Mbps as 3 quantized 128 parallel data stream, and outputs a decoded 112 parallel data stream to a overhead separating circuit 45. The subsequent steps are the same as those in the first embodiment.

The decoder 64 comprises a first decoder 64a, which corresponds to the first decoder 44a, and a second decoder 64b, which corresponds to the second decoder 44b. The first decoder 64a decodes the error-correcting code in the row direction and, as a result, outputs a 3 soft decision value. The second decoder 64b outputs decodes the error-correcting code in the column direction and, as a result, outputs a 3 soft decision value. The second decoder 64b then outputs, based on this soft decision value, the final decoding result.

In general, error correction capability improves remarkably with a soft decision decoding as compared to a hard decision decoding. Consequently, by employing a soft decision decoding, an optical transmission system can be achieved which can transmit a large amount of signals over long distances. A structure may be such that the frame synchronization circuit 43 may determine frame synchronization either by a 3 soft decision data or by a hard decision data.

To sum up, according the second embodiment, the third demultiplexer 51 demultiplexes the j parallel data stream, which is quantized into j bits by the soft decision process, into the (n×j) parallel data stream. The fourth demultiplexer 52 demultiplexes the (n×j) parallel data stream into the (n×m×j) parallel data stream and converts the j data quantized the soft decision process into a low rate (n×m×j) parallel data stream. The FEC frame bottom decoder 53 then carries out the error correction decoding. In this way, with a simple structure signals can be transmitted at a high rate. Further, the error correction capability of such a structure is considerably improved with enhanced transmission rate of a large amount of signals over long distances.

A third embodiment of the present invention is explained next. The general structure of the optical transmission system according to the third embodiment is identical to that of the first embodiment. However, the structure and functionality of a FEC multiplexer 2 and a FEC demultiplexer 6 in the third embodiment are different from those in the first embodiment.

Figure 10:
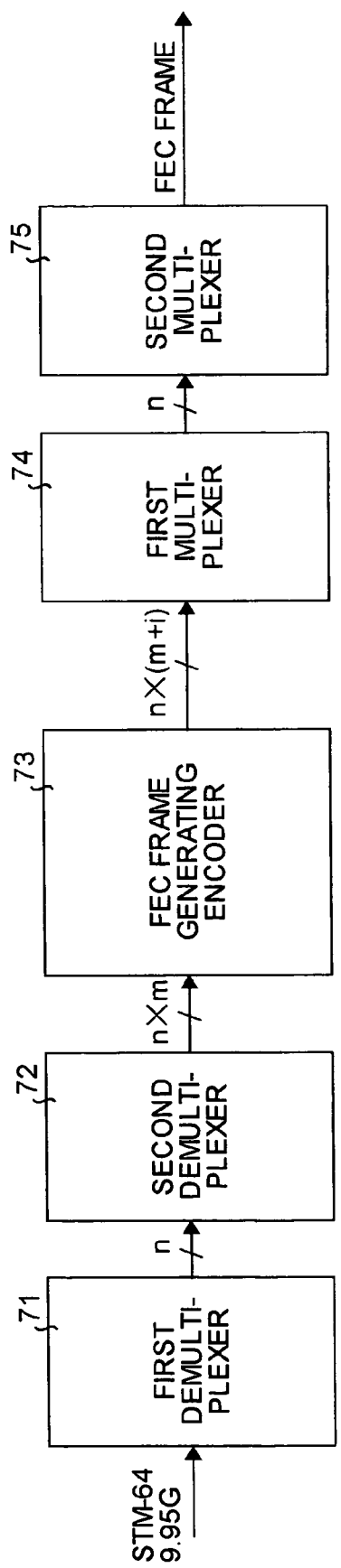
FIG. 10 is a block diagram of a FEC multiplexer of an optical transmission system according to a third embodiment of the present invention.

FIG. 10 is a block diagram of the FEC multiplexer 2 according to the third embodiment. A first demultiplexer 71 demultiplexes serial data stream which are electrical signals of STM-64 (9.95 Gbps) received from a first optical receiver and outputs the serial data stream as n (where n is a positive integer) parallel data stream to a second demultiplexer 72.

The second demultiplexer 72 demultiplexes the received n parallel data stream into (n×m) (where m is a positive integer) parallel data stream and outputs the (n×m) (where m is a positive integer) parallel data stream to a FEC frame generating encoder 73.

The FEC frame generating encoder 73 stores in the received (n×m) parallel data stream an overhead bit, creates a (n×(m+i)) (where m and i are positive integers and m is greater than i) parallel data stream obtained after storing in the redundant data area the error-correcting codes created by error correction encoding, and outputs the (n×(m+i)) parallel data stream to a first multiplexer 74.

The first multiplexer 74 multiplexes the received (n×(m+i)) parallel data stream into n parallel data stream and outputs the n parallel data stream to a second multiplexer 75. The second multiplexer 75 multiplexes and converts the n parallel data stream into a serial data stream, and outputs the serial data stream to a first optical transmitter 3.

Figure 11:
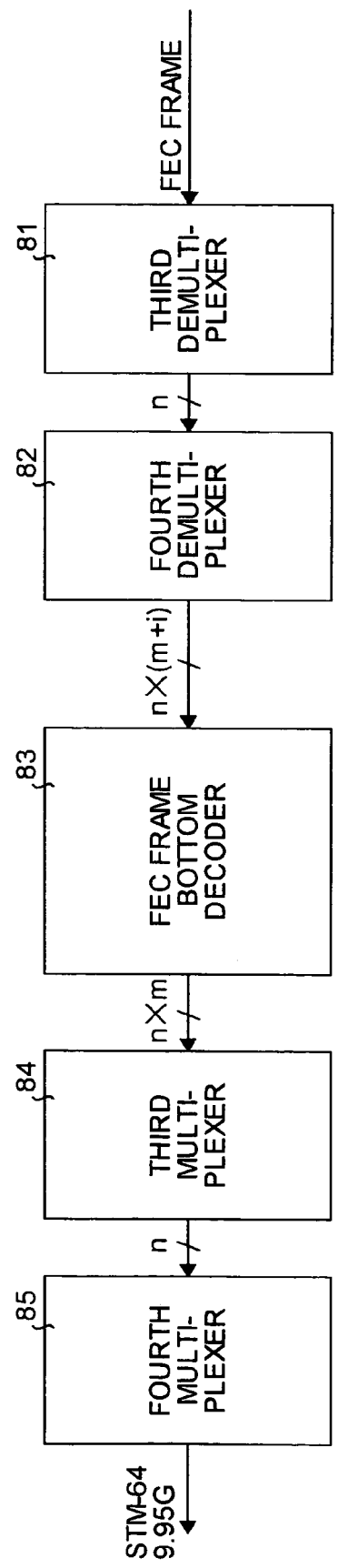
FIG. 11 is a block diagram of a FEC demultiplexer of the optical transmission system according to the third embodiment of the present invention.

FIG. 11 is a block diagram of the FEC demultiplexer 6 according to the third embodiment. A third demultiplexer 81 demultiplexes a FEC frame received from a second optical receiver and outputs as n parallel data stream to a fourth demultiplexer 82. The fourth demultiplexer 82 demultiplexes the received n parallel data stream into (n×(m+1)) parallel data stream and outputs the (n×(m+1)) parallel data stream to a FEC frame bottom decoder 83.

The FEC frame bottom decoder 83 determines the frame synchronization of the (n×(m+1)) parallel data stream received from the fourth demultiplexer 82, carries out error correction decoding based on the extracted overhead bit and the error-correcting codes, finally creates (n×m) parallel data stream, and outputs the (n×m) parallel data stream to a third multiplexer 84. The third multiplexer 84 multiplexes the received (n×m) parallel data stream into n parallel data stream and outputs the n parallel data stream to a fourth multiplexer 85. The fourth multiplexer 85 converts the n parallel data stream received from the third multiplexer 84 into a serial data stream and outputs the serial data stream (electrical signals) as a STM-64 (9.95 Gbps) to a second optical receiver 7.

The FEC frame generating encoder 73 carries out the error correction encoding according to FIG. 4 except that, in this case n1=n×(m+1). As in the first embodiment, in the third embodiment also the error-correcting codes placed in the redundant data areas E4 and E5 are processed in directions that are mutually orthogonal and each error-correcting code is independent of the other error-correcting code. As a result, an error correction in the column direction can be carried out using the error correction result in the row direction. Similarly, an error correction in the row direction can be carried out by using the error correction result in the column direction. In this way, the error correction capability can be considerably improved.

Figure 12:
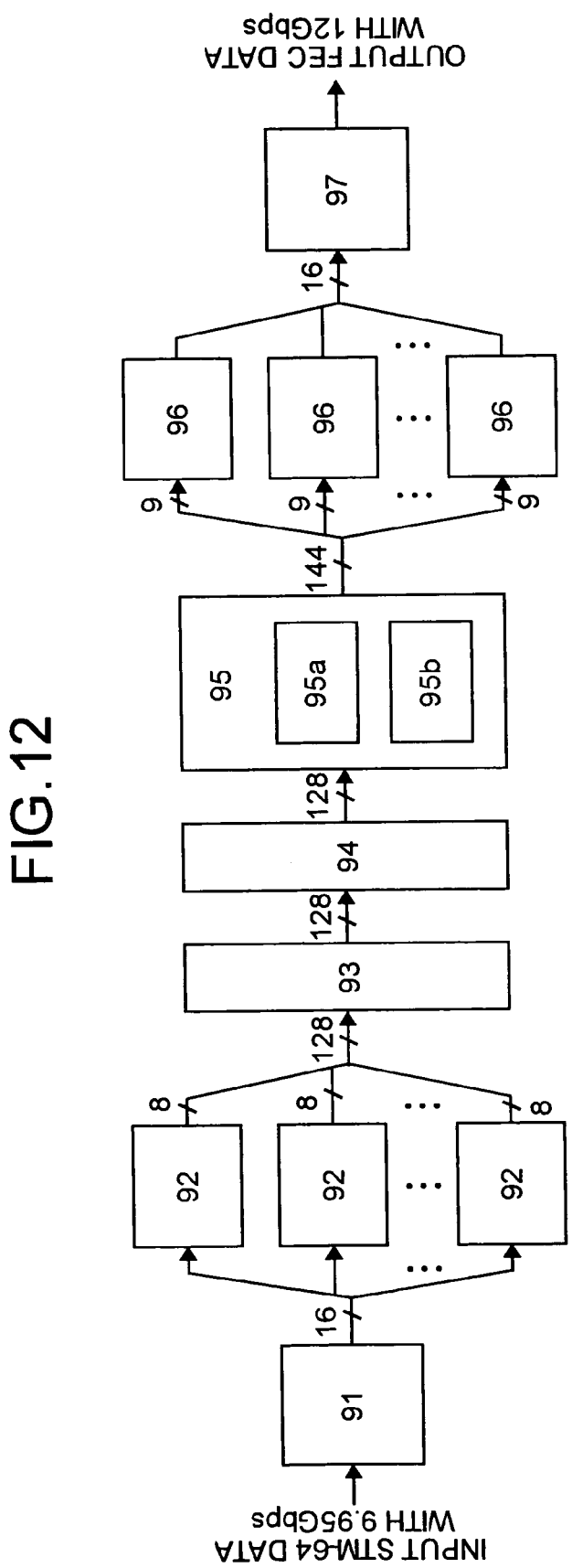
FIG. 12 is a detailed block diagram of the FEC multiplexer shown in FIG. 10.
Figure 13:
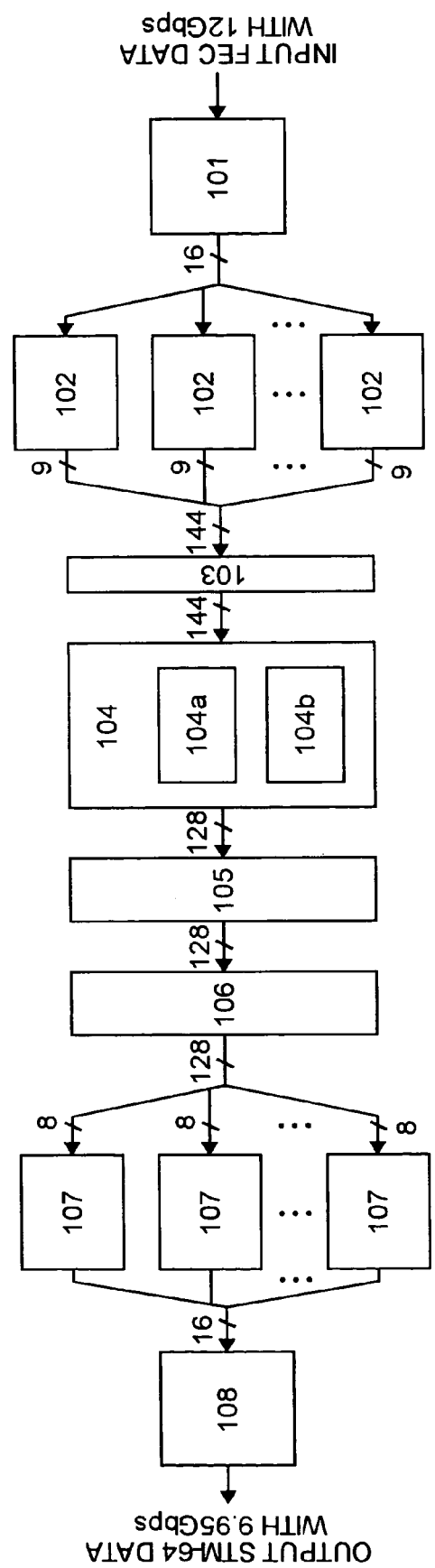
FIG. 13 is a block diagram of the FEC demultiplexer shown in FIG. 11.

The FEC multiplexer 2 and the FEC demultiplexer 6 according to the third embodiment of the present invention are explained in detail next. FIG. 12 is a detailed block diagram of the FEC multiplexer shown in FIG. 10. FIG. 13 is a detailed block diagram of the FEC demultiplexer shown in FIG. 11. The error-correcting codes stored in the redundant data areas E4 and E5 are different BCH codes. The error-correcting code in the redundant data area E4 is a BCH(144, 128) code and that in the redundant data area E5 is a BCH (256,239). In other words, n1=144, n=256, k1=128, k2=239, r1=16, r2=17, and fs1=0.

In FIG. 12, a first 1 to 18 serial-parallel converter 91 demultiplexes a serial data stream of STM-64 (9.95 Gbps), creates 16 parallel data stream of 622 Mbps, and outputs each 16 parallel data stream to a corresponding 1 to 8 serial-parallel converter 92 placed next. There are sixteen 1 to 8 serial-parallel converters 92 arranged in a parallel fashion. Each of the 16-parallel 1 to 8 serial-parallel converters 92 demultiplexes the received 16 parallel data stream into 8 parallel data stream, collectively generates 128 parallel data stream of 78 Mbps, and outputs the 128 parallel data stream to a first rate converter 93.

The first rate converter 93 adds the overhead data area E2 and the redundant data area E4 to the received 128 parallel data stream of 78 Mbps and outputs the 128 parallel data stream of 84 Mbps to an overhead inserting circuit 94. The overhead inserting circuit 94 inserts in the overhead data area E2 overhead bit such as frame synchronization data, etc., required for the maintenance and operation of the optical transmitting system and outputs the 128 parallel data stream to an encoder 95.

The encoder 95 includes a first encoder 95a and a second encoder 95b. The first encoder 95a receives the 128 parallel data stream, calculates the error-correcting code in the column direction. The first encoder 95a then adds the redundant data area E5 to the 128 parallel data stream and stores the error correcting code in the redundant data area E5. The redundant data area E5 increases by the width r1 in the column direction, that is by 16. The second encoder 95b calculates the error-correcting code in the row direction of the 16-added 144 parallel data stream and stores the error-correcting code in the redundant data area E4. Following this, the encoder 95 splits the 144 parallel data stream into 16 and outputs each of the 16 parallel data stream to a corresponding 9 to 1 parallel-serial converter 96. There are sixteen 9 to 1 parallel-serial converters 96 arranged in a parallel fashion.

Each 9 to 1 parallel-serial converter 96 multiplexes the received 144 parallel data stream of 84 Mbps. The multiplexed 14 parallel data stream of 96 Mbps output from each of the sixteen 9 to 1 parallel-serial converter are collectively output as 16 parallel data stream of 753 Mbps to a first 16 to 1 parallel-serial converter 97 placed next. The first 16 to 1 parallel-serial converter 97 multiplexes and converts the received 16 parallel data stream into a FEC frame, which is a serial data stream of Gbps and outputs the serial data stream to the first optical transmitter 3.

The function of the FEC multiplexer shown in FIG. 12 is explained next. The 128 parallel data stream of 78 Mbps output from the sixteen parallel 1 to 7 serial-parallel converters 92 is data that is stored in the data area E1. To this 128 parallel data stream, the overhead data area E2 and the redundant data area E4 are added by the first rate converter 93 following which the data becomes 128 parallel data stream of 84 Mbps. After the overhead bits are stored in the overhead data area E2 of this 128 parallel data stream, the encoder 95 carries out BCH(144,128) encoding for the column direction of the 128 parallel data stream. The encoder 95 then adds the redundant data area E5, stores the error-correcting code in the redundant data area E5, and creates 144 parallel data stream. Following this, the encoder 95 carries out BCH(256,239) encoding for the column direction, stores the error-correcting code in the redundant data area E4, creating 144 parallel data stream of 84 Mbps.

The transmission rate of the final FEC frame of a STM-64 data of 9.95 Gbps increases to 12 Gbps due to addition of the redundant data areas E4 and E5 and the resultant (144/128)× (256/238)-times increase in the row direction and the column direction.

Thus, by creating a frame of BCH(144,128), which are the error-correcting code in the column direction n2, and BCH (256,238), which are the error-correcting code in the row direction n1, the errors occurring in an optical transmission channel 4 are distributed, resulting in a superior error correction capability. Further the second demultiplexer 72 comprises sixteen 1 to 8 serial-parallel converters 92 arranged in a parallel fashion and adds the redundant data area E4 to the data stream. Consequently, the redundant data area E4 is easily added even to high rate data, thereby simplifying the overall circuitry.

In FIG. 13, a second 1 to 16 serial-parallel converter 101 receives the FEC frame from a second optical receiver 5 and demultiplexes the FEC frame of 12 Gbps into 16 parallel data stream of 753 Mbps. Each of the 16 parallel data stream is split into sixteen. Each of the sixteen data stream is output to a corresponding 1 to 9 serial-parallel converter 102 placed next. There are sixteen 1 to 9 serial-parallel converters 102 arranged in a parallel fashion. Each 1 to 9 serial-parallel converter 102 further demultiplexes the received data stream into 9 parallel data stream, collectively generates 144 parallel data stream of 84 Mbps, and outputs the 144 parallel data stream to a frame synchronization circuit 103.

The frame synchronization circuit 103 checks the frame synchronization pattern from the overhead data area E2 of the received 144 parallel data stream, detects the header position of the frame created by the received 144 parallel data stream, and outputs a frame-synchronized 128 parallel data stream to a decoder 104. The decoder includes a first decoder 104a and a second decoder 104b. The first decoder 104a carries out error correction in the row direction based on the error-correcting code stored in the redundant data area E4. The second decoder 104b carries out error correction in the column direction based on the error-correcting code stored in the redundant data area E5 and outputs to an overhead separating circuit 105 128 parallel data stream of 84 Mbps from which the redundant data area E5 has been removed. The overhead separating circuit 105 removes the overhead bit stored in the overhead data area E2 and outputs to a second rate converter 106 the 128 parallel data stream of 78 Mbps from which the overhead bit has been removed.

The second rate converter 106 removes the overhead data area E2 and the redundant data area E4 from the received 128 parallel data stream and converts it into a 128 parallel data stream of 78 Mbps. The second rate converter 106 then outputs the 128 parallel data stream as 8 parallel data stream to each of sixteen 8 to 1 parallel-serial converters 107 arranged next in a parallel fashion. Each of the sixteen 8 to 1 parallel-serial converters 107 then multiplexes the received 8 parallel data stream, collectively generates 16 parallel data stream of 622 Mbps, and outputs the 16 parallel data stream to a second 16 to 1 parallel-serial converter 108. The second 16 to 1 parallel-serial converter 108 multiplexes and converts the received 16 parallel data stream into a STM-64 data of 9.95 Gbps and outputs the STM-64 data to a second optical receiver 7.

The functioning of the FEC demultiplexer is explained next. Based on the error-correcting code in the row direction stored in the redundant data area E4, the first decoder 104a decodes each row of the 128 parallel data stream of 84 Mbps and corrects the bit error. However, when the bit error exceeds the error correction capability, some of the bit errors remain uncorrected. Here, the second decoder 104b also corrects, based on the error-correcting code in the column direction stored in the redundant data area E5, the bit errors remaining in the row direction. Consequently, as the bit errors are distributed between the row directional error-correcting code and the column directional error-correcting codes of the FEC frame, a superior error correction capability can be achieved.

In the encoder 95, error correction encoding in the column direction and the row direction can be achieved by providing an interleaver between the first encoder 95a and the second encoder 95b. The interleaver can be implemented by means of an X-Y converting circuit. The interleaver in the third embodiment of the present invention is included in the second encoder 95b. Similarly, in the decoder 104 as well, error correction encoding in the column direction and the row direction can be achieved by proving an interleaver between the first decoder 104a and the second decoder 104b, and a deinterleaver at the output end of the second decoder 104b. Again, both the interleaver and the deinterleaver are implemented by means of an X-Y converting circuit. The interleaver and the deinterleaver in the third embodiment of the present invention are included in the second decoder 104b.

In the third embodiment of the present invention, during the error correction encoding in the row direction, error correction encoding for the error-correcting code in the column direction, for which the error correction encoding has been done once, is carried out again. This is not a hard and fast rule. That is, during the error correction encoding in the column direction, the error correction encoding for the error-correcting code in the row direction, for which error correction encoding has been done once, may be carried out again. However, error correction in the row direction occurs when error correction encoding in the row direction is carried out while error correction encoding in the column direction is taking place. As a result, the error correction encoding of a higher accuracy can be carried out.

According to the third embodiment of the present invention, the redundant data area E4, in which the error-correcting code obtained by error correction encoding in the row direction of (n×m) parallel data stream are stored, is added by the second demultiplexer 72. The FEC frame generating encoder 73 creates (n×(m+i)) parallel data stream. The FEC frame bottom decoder 83 decodes, based on the (n×(m+i)) parallel data stream into (n×m) parallel data stream. The third multiplexer 84 multiplexes the (n×m) parallel data stream in n parallel data stream. Fast conversion therefore is achieved with such a simple structure. In addition, in the present embodiment, a superior error correction capability is achieved as the bit errors that remain uncorrected following a first error correction are reliably corrected. Hence, an optical transmission system with high error correction capability and in which a transmission of a large amount of signals over long distances can be achieved.

A fourth embodiment of the present invention is explained next. In the fourth embodiment, similar to the second embodiment, a soft decision decoding process has been implemented on the device at the receiver (decoding) end.

Figure 14:
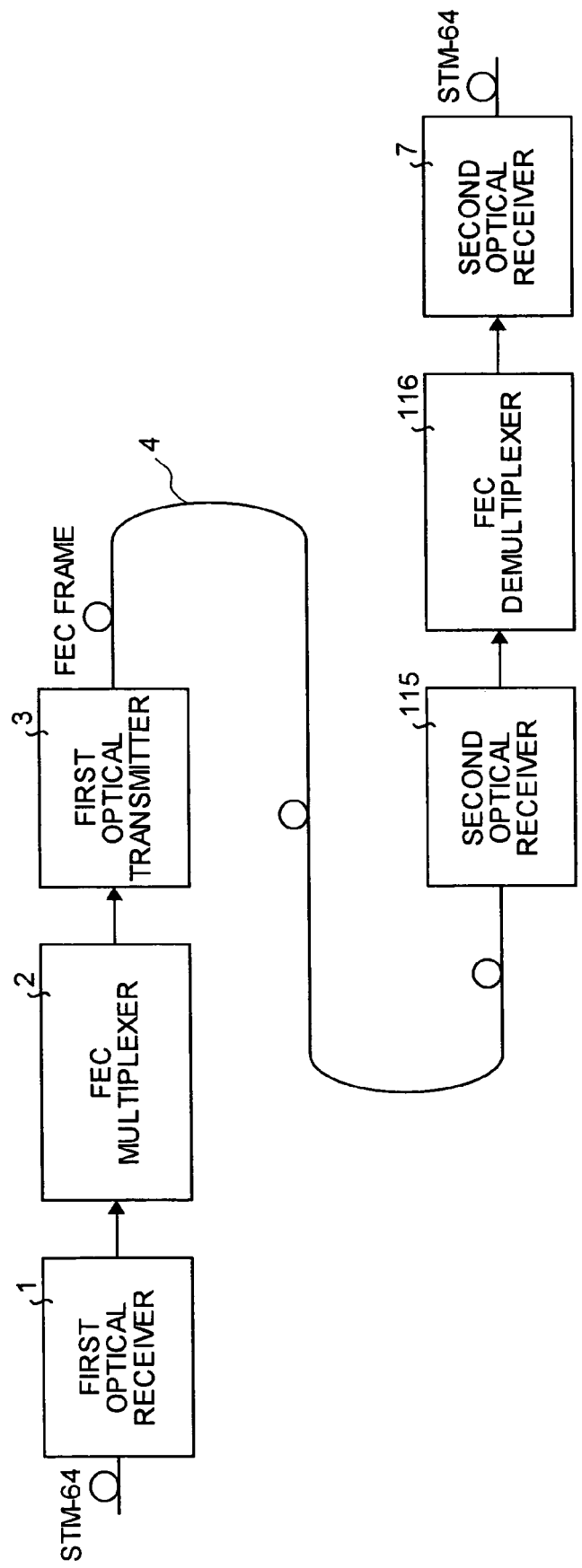
FIG. 14 is a block diagram of an optical transmission system according to a fourth embodiment of the present invention.

FIG. 14 illustrates the overall structure of the optical transmission system according to the fourth embodiment of the present invention. This optical transmission system includes, instead of the second optical receiver 5 and the FEC demultiplexer 6 according to the third embodiment, a second optical receiver 115 and a FEC demultiplexer 116, respectively. The rest of the structure is identical to that of the third embodiment and identical parts in the two embodiments are assigned identical reference numerals. The second optical receiver 115 as well as converting optical signals received from an optical transmission channel 4 into electrical signals, carries out a soft decision process on the electrical signals, quantizes the binary data into j bits (where j is a positive integer of 2 or greater), and outputs a FEC frame as 3 parallel data stream of 13 Gbps to the FEC demultiplexer 116. The FEC demultiplexer 116 carries out a soft decision decoding based on the 3 parallel data stream.

Figure 15:
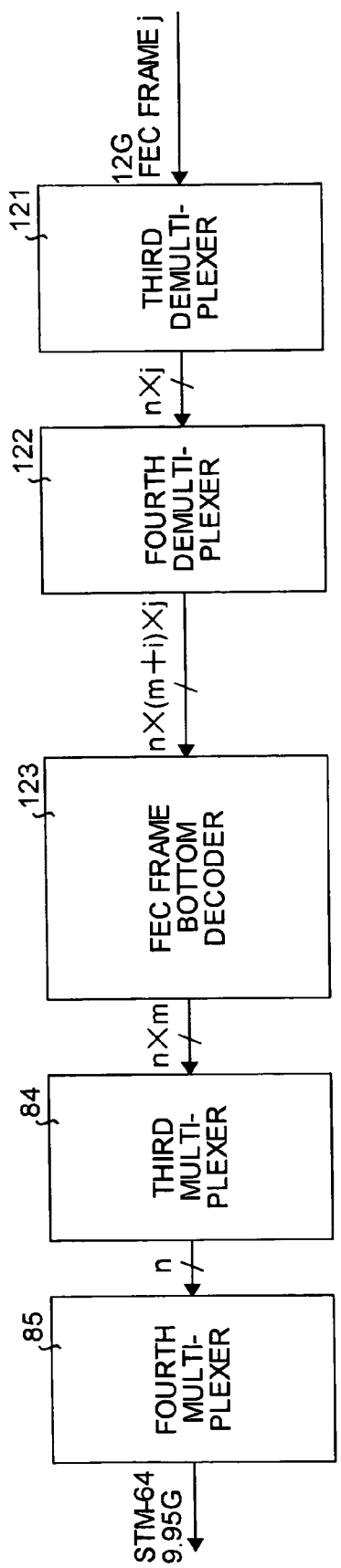
FIG. 15 is a block diagram FEC demultiplexer shown in FIG. 14.

FIG. 15 is a block diagram of the FEC demultiplexer 116 shown in FIG. 14. The FEC demultiplexer 116 includes, instead of the third demultiplexer 81, the fourth demultiplexer 82, and the FEC frame bottom decoder 83 shown in FIG. 11, a third demultiplexer 121, a fourth demultiplexer 122, and a FEC frame bottom decoder 123, respectively. The rest of the structure is similar to the FEC demultiplexer shown in FIG. 11 and identical parts are assigned identical reference numerals.

In FIG. 15, the third demultiplexer 121 demultiplexes j parallel data stream of 12 Gbps received from the second optical receiver 115 into (n×j) parallel data stream and outputs the (n×j) parallel data stream to the fourth demultiplexer 122. The fourth demultiplexer 122 demultiplexes the received (n×j) parallel data stream into (n×(m+i)×j) parallel data stream and outputs the (n×(m+i)×j) parallel data stream to the FEC frame bottom decoder 123. The FEC frame bottom decoder 123 carries out a soft decision decoding based on the received (n×(m+i)×j) parallel data stream and outputs a decoded (n×m) parallel data stream.

Figure 16:
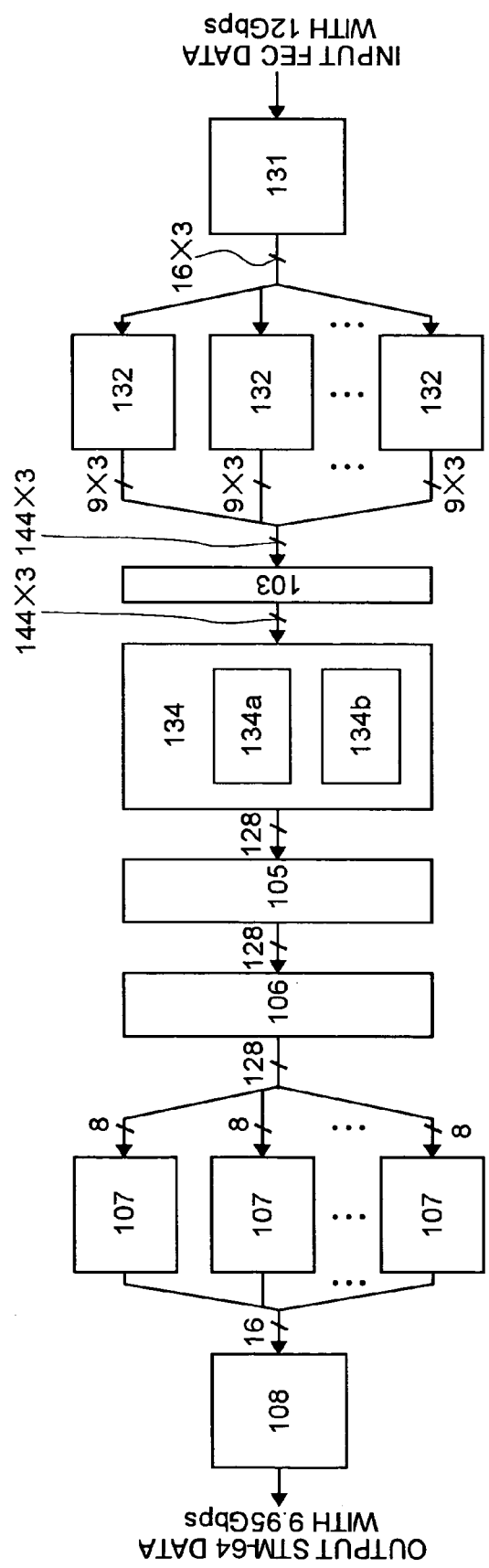
FIG. 16 is a detailed block diagram of the specific detailed structure of the FEC demultiplexer shown in FIG. 14.

The FEC demultiplexer 116 shown in FIG. 14 is explained next with reference to the detailed block diagram shown in FIG. 16. The FEC demultiplexer 116 includes, instead of the second 1 to 16 serial-parallel converter 101, the 1 to 9 serial-parallel converter 102 and the decoder 104 of the demultiplexer shown in FIG. 13, a (1 to 16)×3 serial-parallel converter 131, a (1 to 9)×3 serial-parallel converter 132, and a decoder 134, respectively. The rest of the structure is identical to the FEC demultiplexer shown in FIG. 3 and identical parts are assigned identical reference numerals.

The (1 to 16)×3 serial-parallel converter 131 multiplexes the received 3 data into a 48 (16×3) parallel data stream of 753 Mbps, splits this 48 parallel data stream into 3 streams, and outputs each of the 3 parallel data stream to a corresponding (1 to 9)×3 serial-parallel converter 132 place next. There are sixteen (1 to 9)×3 serial-parallel converters 132 arranged in a parallel fashion. Each (1 to 9)×3 serial-parallel converter 132 demultiplexes the 27 ((9×3)) parallel data stream, collectively generates a 432 ((144×3)) of 84 Mbps, and outputs the 432 parallel data stream to a frame synchronization circuit 103. The frame synchronization circuit 103 checks the frame synchronization pattern from the overhead bit, detects the header position of the FEC frame, and outputs the frame-synchronized 432 parallel data stream to the decoder 134.

The decoder 134 carries out the soft decision decoding of the 432 parallel data stream of 84 Mbps as 3 quantized 144 parallel data stream, and outputs, a decoded 128 parallel data stream to an overhead separating circuit 105. The subsequent steps are the same as those in the third embodiment.

The decoder 134 comprises a first decoder 134a, which corresponds to the first decoder 104a, and a second decoder 134b, which corresponds to the second decoder 104b. The first decoder 134a decodes error-correcting code in the row direction and outputs, as a result, a 3 soft decision value. The second decoder 134b decodes the error-correcting code in the column direction and outputs, as a result, a 3 soft decision value. The second decoder 134 then outputs, based on this soft decision value, the final decoding result. In general, error correction capability improves remarkably with a soft decision decoding as compared to a hard decision decoding. Consequently, by employing a soft decision decoding, an optical transmission system can be achieved which can transmit a large amount of signals over long distances. A structure may be such that the frame synchronization circuit 103 may determine frame synchronization either by a 3 soft decision data or by a hard decision data.

To sum up, according to the fourth embodiment, the third demultiplexer 121 the j parallel data stream, which is quantized into j bits by the soft decision process, into the (n×j) parallel data stream. The fourth demultiplexer 122 demultiplexes the (n×(m+i)×j) parallel data stream into the (n×m×j) parallel data stream and converts the j data quantized the soft decision process into a low rate (n×m) parallel data stream. The FEC frame bottom decoder 123 then carries out the error correction decoding. In this way, with a simple structure signals can be transmitted at a high rate. Further, the error correction capability of such a structure is considerably improved with enhanced transmission rate of a large amount of, signals over long distances.

A fifth embodiment of the present invention is explained next. In the first through fourth embodiments BCH codes are used as error-correcting code in the row direction as well as the column direction. The error-correcting codes need not necessarily be only BCH codes. Other error-correcting codes such as Reed-Solomon codes or, Reed-Muller codes may also be used. Convolution codes may also be used. However, it is preferable to use an error-correcting code in which the volume of redundant bits is fixed, such as in a block code, for maintaining transmission rate.

Further, the error-correcting code in the row direction and the error-correcting code in the column direction may be of different types. The error-correcting codes in the two directions may be selected based on whether the criterion is maintenance of error correction capability or rate of transmission or simplicity of the structure.

A sixth embodiment of the present invention is explained next. In the first through fourth embodiments, error correction encoding is carried out both in the row direction and the column direction. That is error correction encoding in the two directions that are mutually orthogonal. However, in the sixth embodiment, the row direction and the column directions are two different directions which are not mutually orthogonal and in which error-correcting codes are generated.

Figure 17:
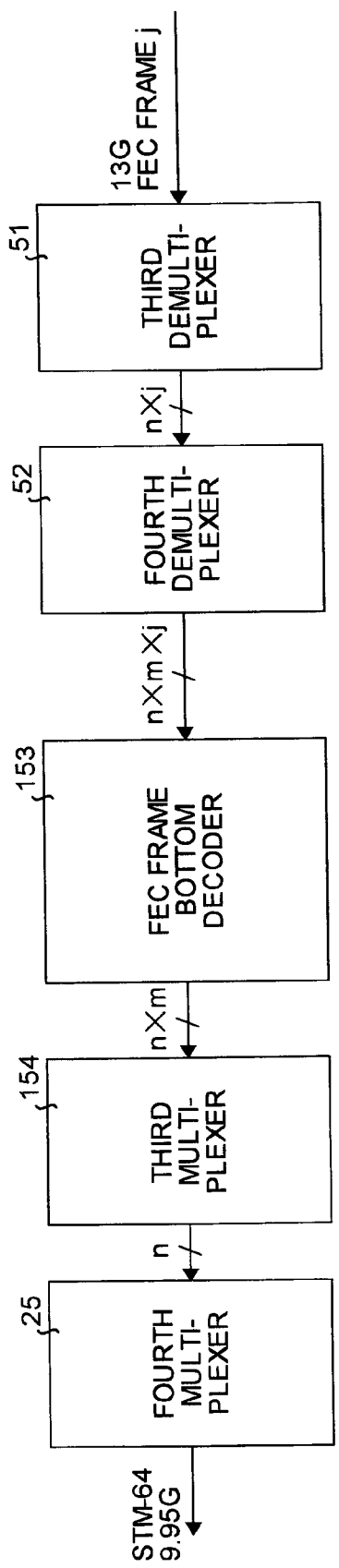
FIG. 17 is a block diagram of a FEC multiplexer of an optical transmission system according to a sixth embodiment of the present invention.
Figure 18:
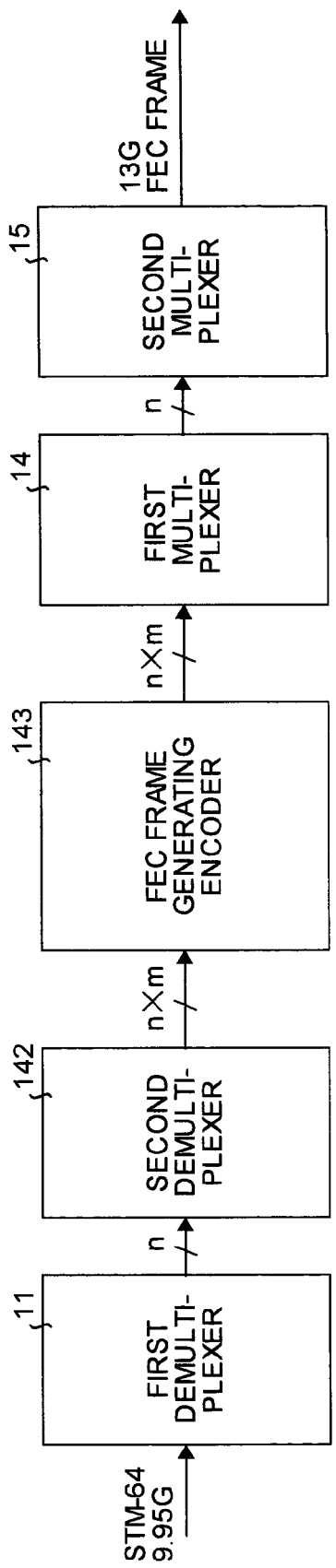
FIG. 18 is a block diagram of a FEC demultiplexer of the optical transmission system according to the sixth embodiment of the present invention.

FIG. 17 is a block diagram of a FEC multiplexer according to the sixth embodiment in an optical transmission system. FIG. 18 is a block diagram of a FEC demultiplexer according to the sixth embodiment. The overall structure of the optical transmission system is identical to the optical transmission system shown in FIG. 7. However, the structures of the FEC multiplexer 2 and the FEC demultiplexer 56 are different and are illustrated, respectively, in FIG. 17 and FIG. 18.

The FEC multiplexer shown in FIG. 17 is identical to the FEC multiplexer shown in FIG. 2. However, the FEC multiplexer shown in FIG. 17 includes, instead of the second demultiplexer 12 and the FEC frame generating encoder 13 in FIG. 2, a second demultiplexer 142 and a FEC frame generating encoder 143, respectively, that are structurally different from their counterparts in FIG. 2. The second demultiplexer 142 demultiplexes n parallel data stream received from a first demultiplexer 11 into (n×m) parallel data stream and outputs the (n×m) parallel data stream to the FEC frame generating encoder 143. The FEC frame generating encoder 143, unlike the FEC frame generating encoder 13, carries out error correction encoding in a diagonal direction and not in the column direction. However, the FEC frame generating encoder 143 does carry out error correction encoding in the row direction. As a result, the direction in which error-correcting codes are generated are not orthogonal. However, as the directions are different, are treated as independent error-correcting codes during error correction decoding. Consequently, the bit errors are distributed between the error-correcting codes in the two directions. As a result, the error correction capability in this case is comparable to the error correction capability in the case in which code generation takes place in mutually orthogonal directions. Besides, as the FEC frame generating encoder 143 generates codes in the diagonal direction, there is no need to add an error-correcting code at the end (bottom) of the column direction. Therefore, an error-correcting code may be added only at the end of the row direction. As a result, the second demultiplexer 142 does not need to add an area corresponding to the redundant data area E5, making the structure simpler. In this case, the FEC frame generating encoder 143 carries out a rate change corresponding to the addition of error-correcting code in the diagonal direction.

The FEC demultiplexer shown in FIG. 18 is identical to the FEC demultiplexer shown in FIG. 8. However, the FEC demultiplexer shown in FIG. 18 includes, instead of the FEC frame bottom decoder 53 and the third multiplexer 24 in FIG. 8, a FEC frame bottom decoder 153 and a third multiplexer 154, respectively, that are structurally different from their counterparts in FIG. 8. The FEC frame bottom decoder 153 carries out decoding based on the error-correcting code in the row direction that are added by the FEC frame generating encoder 143. The FEC frame bottom decoder 153 then carries out decoding based on the error-correcting code in the diagonal direction. The subsequent steps are identical to those of the FEC frame bottom decoder 53. In this case, the FEC frame bottom decoder 153 outputs to a third multiplexer 154 an (n×m) parallel data stream. The third multiplexer 154, like the second demultiplexer 142, has a simple structure since it does not need to remove an area corresponding to the redundant data area E5.

FIG. 19(a) and (b) are schematic diagrams that illustrate the error correction encoding process of the FEC frame generating encoder 143 shown in FIG. 17. Error correction encoding of the received (n×m) parallel data stream takes places first in the diagonal direction, as shown in FIG. 19(b). The resulting error-correcting code is stored in a redundant data area E15 which is located at the end of the row direction. Following this, error correction encoding in the row direction, including the redundant data area E15, is carried out. The resulting error-correcting code is stored in a redundant data area E14 which is located after the redundant data area E15. Consequently, the error-correcting code generated in the row direction, which is at 45° with respect to the diagonal direction, and is independent of the error-correcting code generated in the diagonal direction.

In the sixth embodiment, error correction encoding is shown to be carried out in a single frame. However, multi-frame error correction encoding may also be carried out and an error correction encoding for this error correction encoding may also be carried out.

Figure 20:
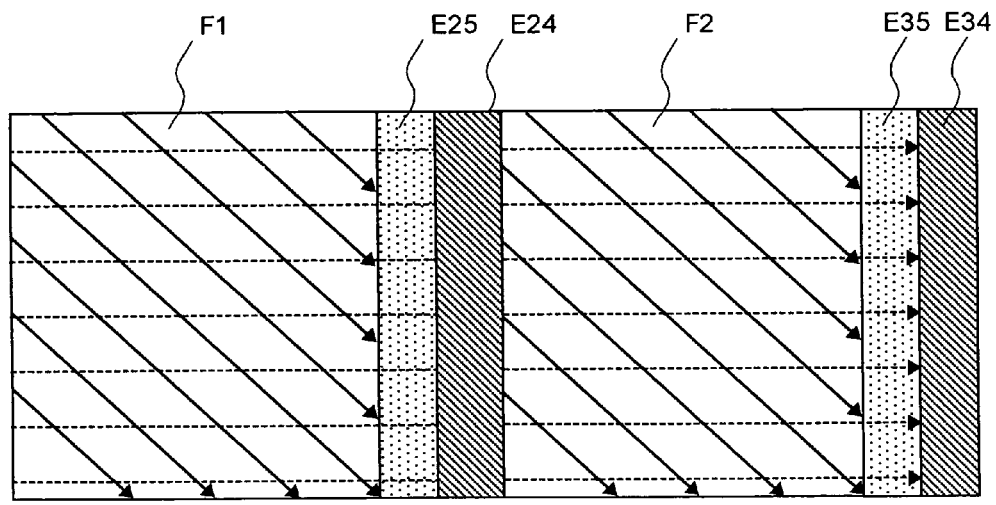
FIG. 20 illustrates an example of the process of error correction encoding carried out with respect to a multiframe by means of the FEC multiplexer shown in FIG. 18.

FIG. 20 illustrates an example of the error correction encoding process in a multi-frame setup. Frames F1 and F2 are considered as a single frame and error correction encoding is carried out for them in the diagonal direction. The resulting error-correcting code is split and stored in a redundant data area E25 for the frame F1 and a redundant data area E35 for the frame F2. Following this, error correction encoding is carried out in the row direction of the frames F1 and F2, which now include the redundant data areas E25 and E35. The resulting error-correcting codes are stored in a redundant data area E24 for the frame F1 and a redundant data area E34 for the frame F2.

During error correction decoding in this kind of a multi-frame setup, first an error correction decoding is carried out based on the error-correcting codes in the row direction stored in the redundant data areas E24 and E34 of the frames F1 and F2, respectively, which also includes redundant data areas E25 and E35. Following this, an error correction decoding is carried out, considering the frames F1 and F2 as a single frame, based on the error-correcting code in the diagonal direction that is split and stored in the redundant data areas E25 and E35 of the frames F1 and F2, respectively.

According to the sixth embodiment of the present invention, error-correcting code is generated in the diagonal direction as well as the row direction. The structures of the second demultipelxer 142 and the third multiplexer 154 are simplified as a combined error correction encoding is carried out. As a result, high rate transmission with high error correction capability can be achieved with a simple structure.

A seventh embodiment of the present invention is explained next. In the first through sixth embodiment, the FEC frame bottom decoder in the first stage carries out error correction decoding using the error-correcting code in the row direction and then in the second stage carries out error correction decoding using the error-correcting code in the column direction or the diagonal direction, as the case may be. However, in the seventh embodiment, error correction decoding is carried out by repeating plural first and second stages in a continuous manner.

In other words, if a FEC frame generating encoder carries out turbo encoding, according to the seventh embodiment of the present invention, the FEC frame bottom decoder carries out decoding of the turbo codes, enhancing the error correction capability. Using a soft decision process can particularly result in a superior error correction capability.

Figure 21:
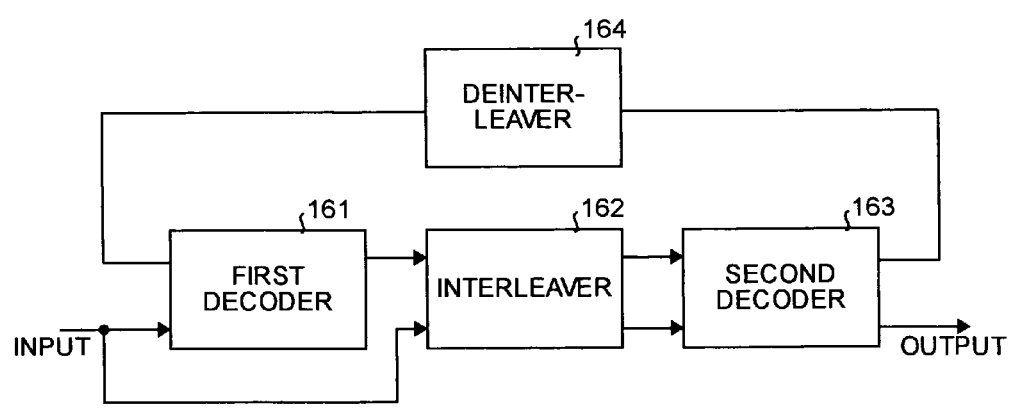
FIG. 21 is a block diagram that illustrates an example of an outline structure of a process of error correction encoding in a FEC multiplexer according to a seventh embodiment of the present invention.
Figure 22:
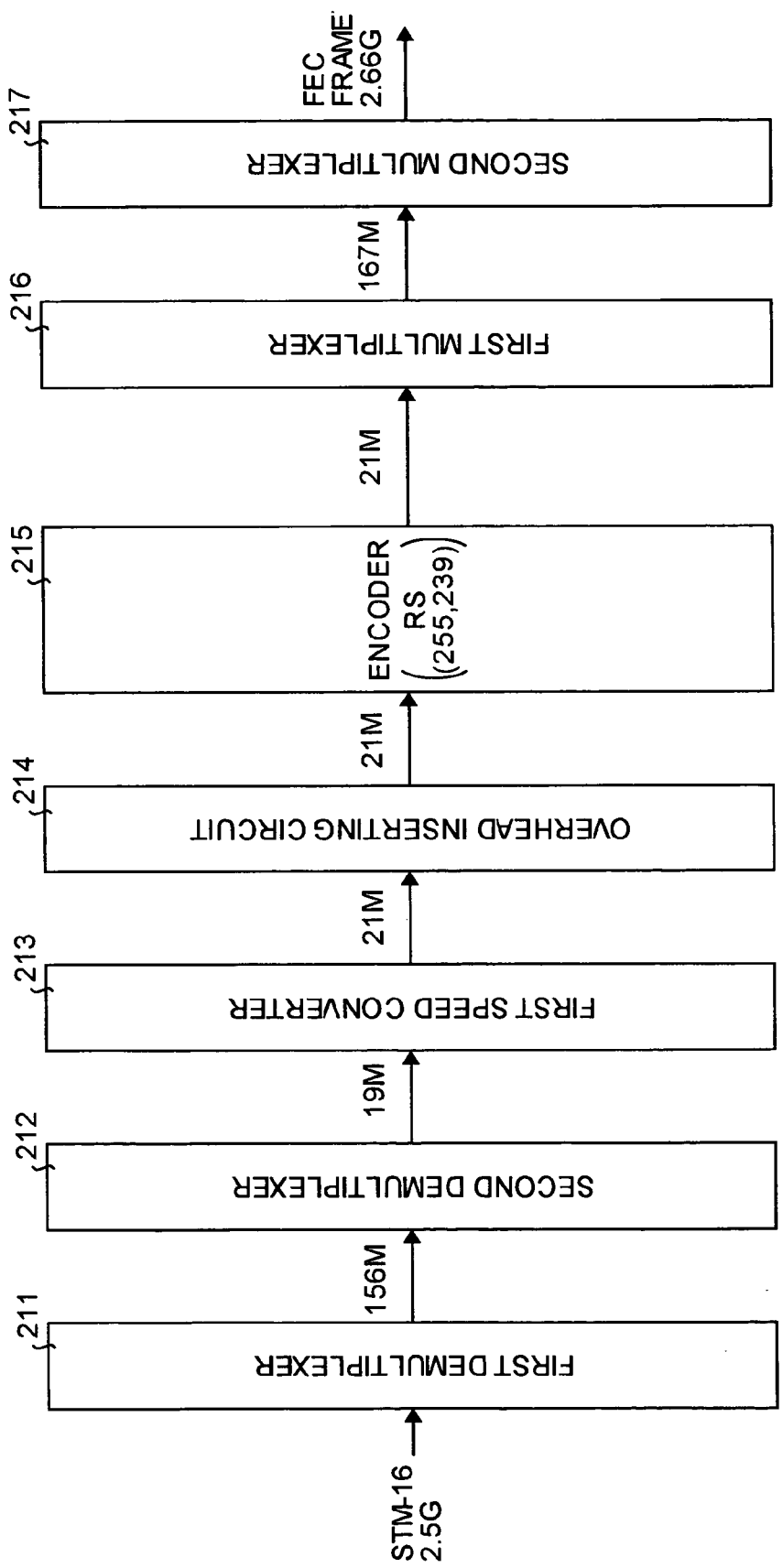
FIG. 22 is a block diagram of a FEC multiplexer according to a conventional optical transmission system.
Figure 23:
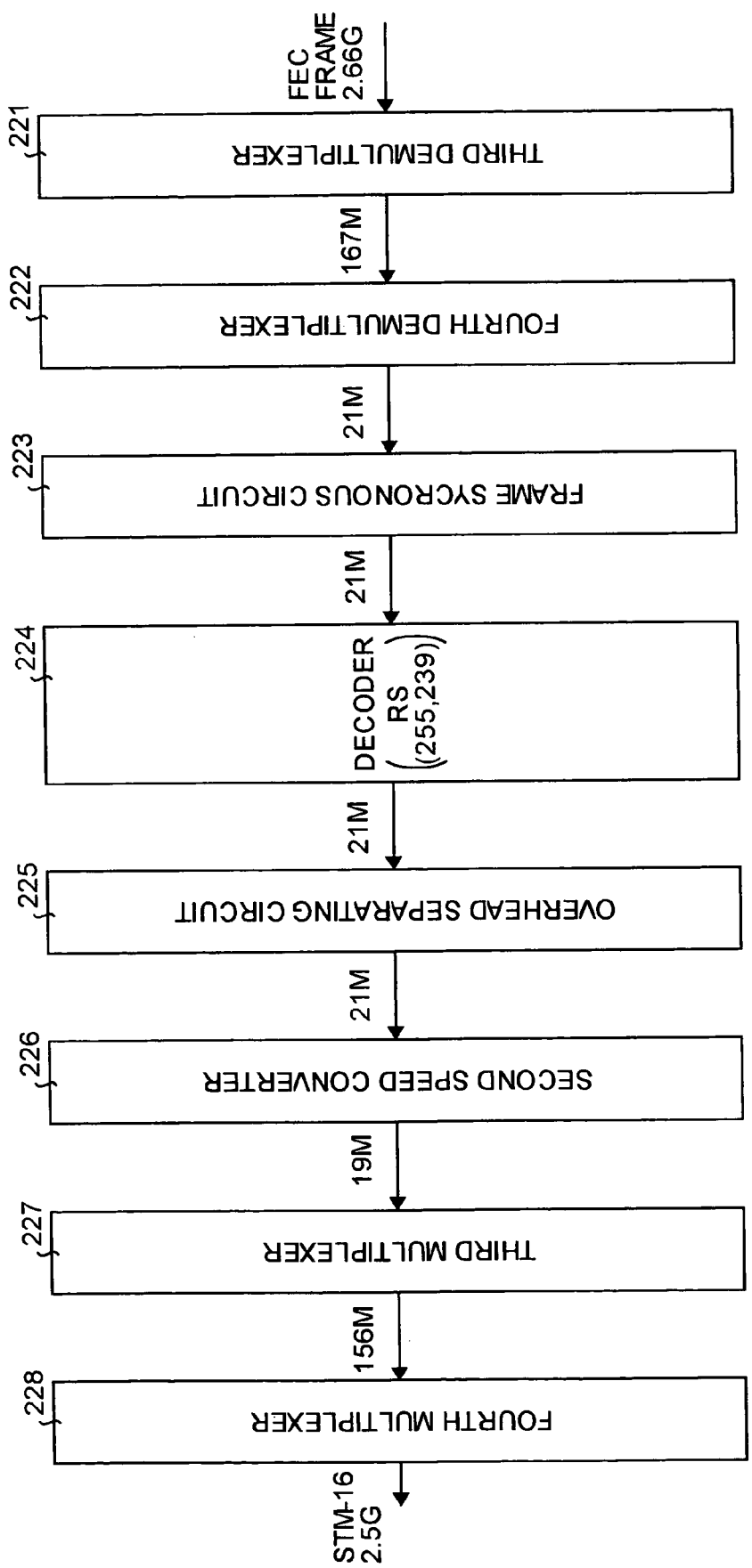
FIG. 23 is a block diagram of a FEC demultiplexer according to the conventional optical transmission system.
Figure 24A:
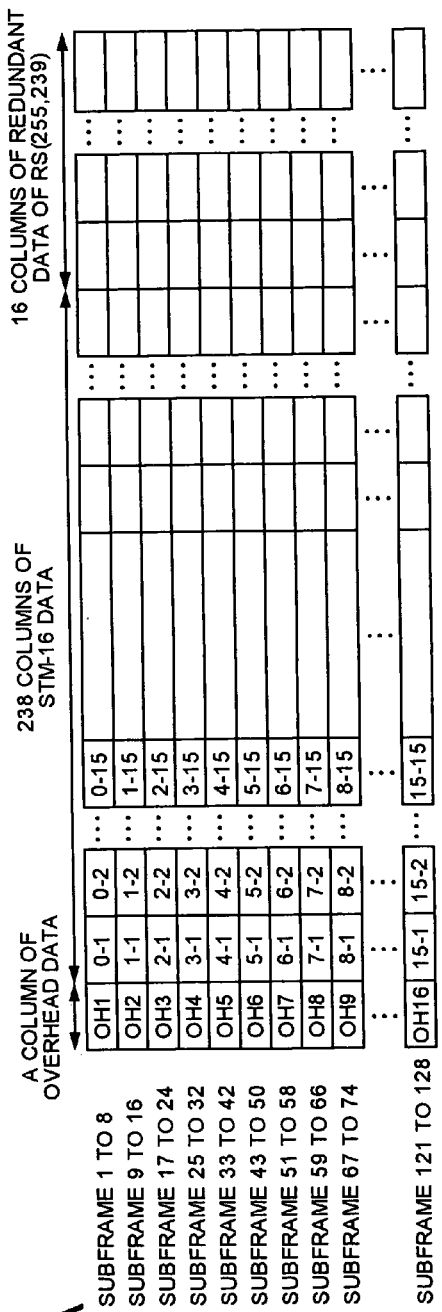
FIG. 24A and FIG. 24B illustrate a frame structure of a FEC frame.
Figure 24B:
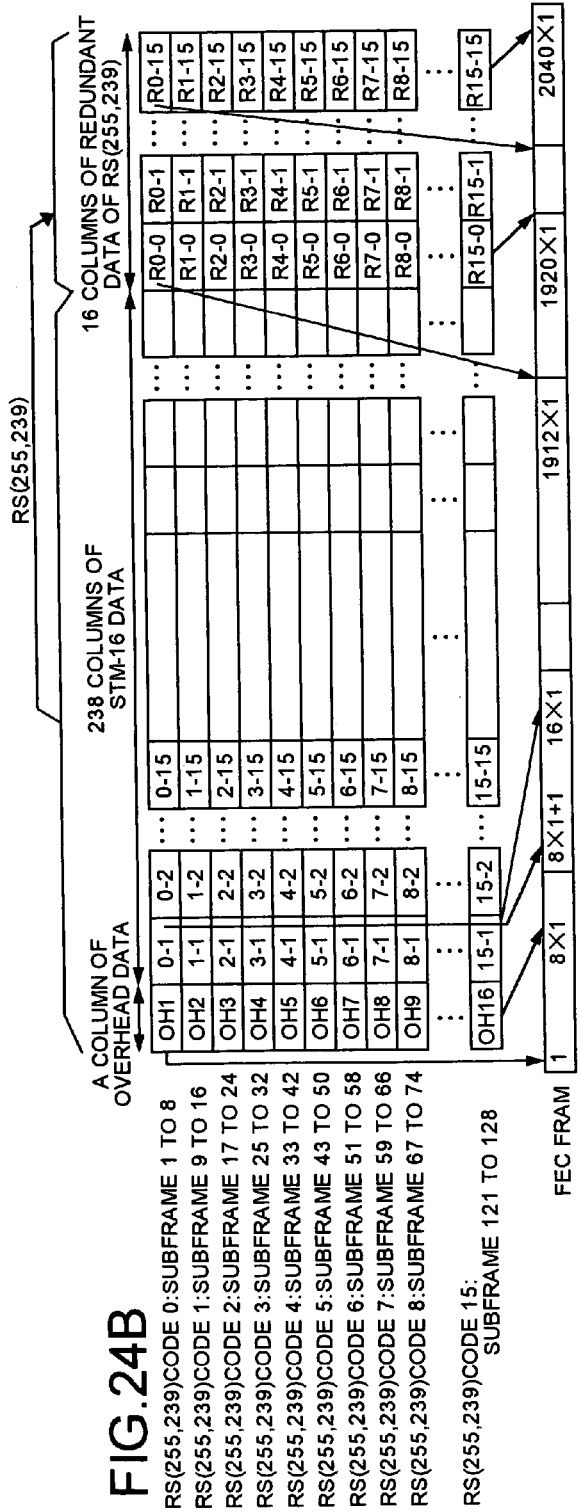

FIG. 21 is a block diagram of a decoder according to the seventh embodiment of the present invention employed in an optical transmission system. A first decoder 161 outputs to an interleaver 162 a soft decision value obtained by decoding error-correcting code in the row direction. A second decoder 163 outputs to a deinterleaver 164 a soft decision value obtained by decoding error-correcting code in the column or diagonal direction for the data interleaved by the interleaver 162. The deinterleaver 164 outputs the soft decision value to the first decoder 161. In this way, the decoding by the first decoder 161 and the second decoder 163 is repeated a specified number of times. The final decoding result is output from the second decoder. Since the same first decoder 161, interleaver 162, second decoder 163, and deinterleaver 164 carry out the cycles repeatedly, the structure remains simple.

An eighth embodiment of the present invention is explained next. In the first through seventh embodiments dummy bits are added in the fixed stuff area E3. However, in the eighth embodiment overhead bits are stored in a fixed stuff area E3.

In other words, the fixed stuff area E3 is used as an overhead data area E2. As a result, the amount of data required for maintenance and operation of an optical transmission system can be further increased.

To sum up, according to the present invention, a demultiplexer receives and demultiplexes a serial data stream into plural bit parallel data stream. A first encoder carries out error correction encoding in a first direction of a matrix constituted by the parallel data stream and adds a first error-correcting code to the parallel data stream. A second encoder carries out error correction encoding in a second direction of the matrix constituted by the parallel data stream and adds a second error-correcting code to the parallel data stream. A multiplexer multiplexes the parallel data stream encoded by the first encoder and the second encoder and outputs a serial data stream. The error-correcting codes in the two directions are independent of each other because of the serial data stream, and the bit errors are distributed. Consequently, the transmission rate of the transmission data itself is enhanced and besides the increase in the transmission rate due to the redundant bit. Even if there is deterioration in the transmission characteristics, error correction capability can be enhanced.

According to the next invention, in the above invention, the demultiplexer demultiplexes the received serial data stream into n parallel data stream (where n is a positive integer) and demultiplexes the n parallel data stream further into (n×m) parallel data stream (where m is a positive integer). The first encoder and the second encoder outputs the received (n×m) parallel data stream as (n×(m+i)) parallel data stream (where m and i are positive integers and m is greater than i) to the multiplexer. The multiplexer multiplexes the received (n×(m+i)) parallel data stream into n parallel data stream and outputs the n parallel data stream as a serial data stream. Consequently, an encoding that is consistent with the error correction encoding is reliably carried out.

According to the next invention, in the above invention, the first encoder carries out an error correction encoding in the column direction of the matrix constituted by the parallel data stream and adds the resulting first error-correcting code to the parallel data stream. The second encoder carries out error correction encoding and adds the resulting second error-correcting code to the parallel data stream. The error correction encoding by the first encoder is independent of the error correction encoding by the second encoder. Consequently, an enhanced error correction capability is achieved.

According to the next invention, in the above invention, the first encoder adds the first error correcting code to a specific row at the end of columns of the parallel data stream and the second encoder adds the second error correcting code to a specific column at the end of the rows of the parallel data stream. Consequently, a soft process can be carried out corresponding to the matrix form of the parallel data stream.

According to the next invention, in the above invention, the demultiplexer adds to the parallel data stream an area in which the first error-correcting code generated by the first encoder is stored. The load on the first encoder and the second encoder is reduced as the areas for storing the error correcting codes are created when there is flexibility during low rate. Besides, areas for error-correcting codes are formed using a simple structure.

According to the next invention, in the above invention, the first encoder carries out error correction encoding in a diagonal direction of the matrix constituted by the parallel data stream and adds the resulting error-correcting code to the parallel data stream. The second encoder carries out error correction encoding in the row direction of the matrix constituted by the parallel data stream and adds the resulting error-correcting code to the parallel data stream. The directions of the error correction encoding by the first encoder and the second encoder are therefore not orthogonal. Consequently, even if the two error-correcting codes are of the same type, independent error-correcting codes that are soft and multiplexed can be realized.

According to the next invention, in the above invention, the first encoder adds the first error-correcting code to a specific row at the end of the columns of the parallel data stream. The second encoder adds the second error-correcting code adjacent to error-correcting code added by the first encoder. Consequently, soft processing corresponding to the matrix form of the parallel data stream can be carried out.

According to the next invention, in the above invention, the second encoder carries out error correction encoding for the parallel data stream which includes the first error-correcting code added by the first encoder and adds the resulting second error-correcting code to the parallel data stream. In this way, the second encoder also corrects the errors in the error-correcting code generated by the first encoder. As a result, an enhanced error correction capability is achieved.

According to the next invention, in the above invention, the first error-correcting code added by the first encoder and the second error-correcting code added by the second encoder differ in their coding systems. Consequently, a soft error correction multiplexer, suited to the system in which the error correction multiplexer is implemented, can be realized.

According to the next invention, in the above invention, the first error-correcting code added by the first encoder and the second error-correcting code added by the second encoder are block codes. Consequently, the capacity of the error-correcting codes can be fixed. As a result, the structure of the encoders can be kept simple and a stable operation of the encoders is achieved.

According to the next invention, in the above invention, the first error-correcting code added by the first encoder and the second error-correcting code added by the second encoder are calculated in the same block coding system, and differ in the coding conditions. As a result, enhanced softness is maintained and the encoding process is carried out with effectiveness.

According to the next invention, in the above invention, the parallel data stream includes a data area, an overhead data area in the column direction that is added to the beginning of the row direction of the data area, and a fixed stuff area, which absorbs the difference arising from the parallel data stream matrix. Consequently, demultiplexing and multiplexing are easily carried out.

According to the next invention, in the above invention, the quantity of the overhead bits is increased by storing the overhead bits in the fixed stuff area. Consequently, the maintenance and operation of the system in which the error correction multiplexer is implemented can be carried out more reliably without having to increase the transmission capacity.

According to the next invention, in the above invention, a demultiplexer demultiplexes into parallel data stream a multiplexed serial data stream of plural error-correcting codes generated by error correction encoding in two different directions of a parallel data stream.

A decoder gradually decodes the parallel data stream by the plural error-correcting codes and outputs a decoded parallel data stream. A multiplexer multiplexes the parallel data stream decoded by the decoder and outputs a serial data stream. The decoding is carried out by the decoder using the independent error-correcting codes. Consequently, the transmission rate of the transmission data itself can be enhanced. Further, transmission rate can be enhanced by addition of the redundant bits. Besides, even if the transmission characteristic deteriorates, an enhanced error correction capability can be achieved.

According to the next invention, in the above invention, a first optical receiver converts received an optical signal into an electrical signals. Any one of the error correction multiplexers according to the present invention processes the serial data stream output from the first optical receiver. A first optical transmitter converts into an optical signal the electrical signal output from the error correction multiplexer and transmits the optical signal to the optical transmission channel. A second optical receiver converts the optical signal received from the optical transmission channel into an electrical signal. Any one of the error correction demultiplexers according to the present invention processes the electrical signals output from the second optical receiver. A second optical transmitter converts the electrical signal output from the error correction demultiplexer into an optical signal. Consequently, the transmission rate of the transmission data itself can be enhanced. Further, transmission rate can be enhanced by addition of the redundant bits. Besides, even if the transmission characteristic deteriorates, an enhanced error correction capability can be achieved. As a result, an optical transmission system that can transmit a large amount of signals over long distance can be realized.

According to the next invention, in the above invention, in a demultiplexing step, received serial data stream is demultiplexed into parallel data stream. In a first encoding step, error correction encoding is carried out in a first direction of the matrix constituted by the parallel data stream. In a second encoding step, error correction encoding is carried out in a second direction of the matrix constituted by the parallel data stream. The resulting first and second error-correcting codes are added to the parallel data stream. In a multiplexing step, the parallel data stream, to which the plural error-correcting codes are added in the first and second encoding steps, is multiplexed and output as a serial data stream. Consequently, the transmission rate of the transmission data itself can be enhanced. Further, transmission rate can be enhanced by addition of the redundant bits. Besides, even if the transmission characteristic deteriorates, an enhanced error correction capability can be achieved.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

INDUSTRIAL APPLICABILITY

An error correction multiplexer, an error correction demultiplexer, an optical transmission system employing the error correction multiplexer and the error correction demultiplexer, and an error correction multiplexed transmission method according to the present invention is suitable for correction of bit errors caused by deterioration of signal-to-noise ratio, based on forward error correction, and implementing long-haul, high-capacity transmission.

The invention claimed is:

1. An error correction multiplexer comprising:
a demultiplexer that demultiplexes first serial data stream into parallel data stream constituting a matrix wherein the matrix includes a data area, an overload area containing maintenance and operation information, a fixed stuff area which contains overflow data and a row direction redundant area which contains error correcting code in the column direction and a column direction redundant area which contains error correcting code in the row direction;
a first encoder that calculates a first error correcting code from data in a first direction of the matrix, and adds the first error correcting code to the parallel data stream;
a second encoder that calculates a second error correcting code from data in a second direction of the matrix, and adds the second error correcting code to the parallel data stream; and
a multiplexer that multiplexes the parallel data stream that is error-correction-coded based on the first error correcting code and the second error correcting code into second serial data stream, and outputs the second serial data stream.

2. The error correction multiplexer according to claim 1, wherein
the demultiplexer demultiplexes the first serial data stream into n parallel data stream, and demultiplexes the n parallel data stream into n×(m−i) parallel data stream, where n, m, and i are positive integers, and m is larger than i,
the first encoder and the second encoder convert the n×(m−i) parallel data stream into n×m parallel data stream, and
the multiplexer multiplexes the n×m parallel data stream to n parallel data stream, and multiplexes the n parallel data stream into the second serial data stream.

3. The error correction multiplexer according to claim 1, wherein the demultiplexer demultiplexes the first serial data steam into n parallel data stream, and demultiplexes the n parallel data stream into n×m parallel data stream, where n and m are positive integers, the first encoder and the second encoder convert the n×m parallel data stream to n×(m+i) parallel data stream, where i is a positive integer, and m is larger than i, and the multiplexer multiplexes the n×(m+i) parallel data stream to n parallel data stream, and multiplexes the n parallel data stream into the second serial data stream.

4. The error correction multiplexer according to claim 1, wherein
the first direction is column direction of the matrix, and
the second direction is row direction of the matrix.

5. The error correction multiplexer according to claim 4, wherein
the first encoder adds the first error correcting code to a predetermined row at an end of the column direction; and
the second encoder adds the second error correcting code to a predetermined column at an end of the row direction.

6. The error correction multiplexer according to claim 4, wherein
the demultiplexer adds a data area to the parallel data steam, wherein the data area is to be assigned with the first error correcting code.

7. The error correction multiplexer according to claim 1, wherein
the first correcting code and the second correcting code differ in code format.

8. The error correction multiplexer according to claim 1, wherein
the first correcting code and the second correcting code are block codes.

9. The error correction multiplexer according to claim 1, wherein
the first correcting code and the second correcting code have same type of block code format, with different error correction codes.

10. The error correction multiplexer according to claim 1, wherein the parallel data stream includes
an information area;
an overhead information area that is added to a top of row direction of the information area to form a column of the matrix; and
a fixed stuff area to ensure a size of the matrix.

11. The error correction multiplexer according to claim 10, wherein
the fixed stuff area stores overhead information.

12. An error correction multiplexer comprising:
a demultiplexer that demultiplexes first serial data stream into parallel data steam constituting a matrix;
a first encoder that calculates a first error correcting code from data in a first direction of the matrix, and adds the first error correcting code to the parallel data stream;
a second encoder that calculates a second error correcting code from data in a second direction of the matrix, and adds the second error correcting code to the parallel data stream; and
a multiplexer that multiplexes the parallel data stream that is error-correction-coded based on the first error correcting code and the second error correcting code into second serial data steam, and outputs the second serial data stream,
wherein the first direction is a diagonal direction of the matrix, and the second direction is a row direction of the matrix.

13. The error correction multiplexer according to claim 12, wherein
the first encoder adds the first error correcting code to a predetermined row at an end of a column direction of the matrix; and
the second encoder adds the second error correcting code to a row adjacent to an end of the row assigned with the first error correcting code.

14. The error correction multiplexer according to claim 12, wherein
the second encoder calculates the second error correcting code from data including the first correcting code.

15. An error correction demultiplexer comprising:
a demultiplexer that demultiplexes first serial data stream into first parallel data stream, wherein the first serial data stream is multiplexed with a plurality of error correcting codes, and each error correcting code is calculated from data in different direction of a matrix formed by second parallel data stream wherein the matrix includes a data area, an overload area containing maintenance and operation information, a fixed stuff area which contains overflow data and a row direction redundant area which contains error correcting code in the column direction and a column direction redundant area which contains error correcting code in the row direction;
a decoder that decodes the first parallel data stream into third parallel data stream based on the error correcting codes; and
a multiplexer that multiplexes the third parallel data stream into second serial data stream, and outputs the second serial data stream.

16. The error correction demulfiplexer according to claim 15, wherein
the demultiplexer demultiplexes the first serial data stream into n parallel data stream, and demultiplexes the n parallel data stream into n×m parallel data stream, where n and m are positive integers,
the decoder converts the n×m parallel data stream to n×(m−i) parallel data stream, where i is a positive integer, and m is larger than i, and
the multiplexer multiplexes the n×(m−i) parallel data stream to n parallel data stream, and multiplexes the n parallel data stream into the second serial data stream.

17. The error correction demultiplexer according to claim 15, wherein
the demultiplexer demultiplexes the first serial data stream into n parallel data stream, and demultiplexes the n parallel data stream into n×(m+i) parallel data stream, where n, m, and i are positive integers, and m is larger than i,
the decoder converts the n×(m+i) parallel data stream to n×m parallel data stream, and
the multiplexer multiplexes the n×m parallel data stream to n parallel data stream, and multiplexes the n parallel data stream into the second serial data stream.

18. The error correction demultiplexer according to claim 15, wherein
the decoder includes
a first decoder that extracts a first error correcting code from the first parallel data stream, and applies error correction decoding process to data in a first direction of a matrix formed by the first parallel data stream, wherein the first direction corresponds to the first error correcting code; and
a second decoder that extracts a second error correcting code from the first parallel data stream, and applies the error correction decoding process to data in a second direction of the matrix formed by the first parallel data stream, wherein the second direction corresponds to the second error correcting code.

19. The error correction demultiplexer according to claim 18, wherein
the second decoder performs the error correction decoding process by using a result of the decoding by the first decoder.

20. The error correction demultiplexer according to claim 19, wherein
the demultiplexer demultiplexes fourth parallel data stream that is quantized into a plurality of bits by soft decision processing,
the first decoder and the second decoder decode data by soft decision decoding, and
the second decoder decode data by using a result of the decoding by the first decoder.

21. The error correction demultiplexer according to claim 19, wherein
the demultiplexer demultiplexes fourth parallel data stream that is quantized into a plurality of bits by soft decision process,
the first decoder and the second decoder are cascaded to perform soft decision decoding iteratively.

22. The error correction demultiplexer according to claim 19, wherein
the second decoder re-inputs results of the decoding for predetermined number of times of repetition to the first decoder to perform the soft decision decoding iteratively.

23. An optical transmission system comprising:
a first optical receiver that converts first optical signals into electrical signals to generate first serial data stream;
an error correction multiplexer that includes
a first demultiplexer that demultiplexes the first serial data stream into first parallel data stream constituting a matrix wherein the matrix includes a data area, an overload area containing maintenance and operation information, a fixed stuff area which contains overflow data and a row direction redundant area which contains error correcting code in the column direction and a column direction redundant area which contains error correcting code in the row direction;
a first encoder that calculates a first error correcting code from data in a first direction of the matrix, and adds the first error correcting code to the first parallel data stream;
a second encoder that calculates a second error correcting code from data in a second direction of the matrix, and adds the second error correcting code to the first parallel data stream; and
a first multiplexer that multiplexes the first parallel data stream that is error-correction-coded based on the first error correcting code and the second error correcting code into second serial data stream, and outputs the second serial data stream;
a first optical transmitter that converts the second serial data stream into second optical signals;
an optical transmission line to transmit the second optical signals;
a second optical receiver that converts the second optical signals input through the optical transmission line into electrical signals to generate third serial data stream;
an error correction demultiplexer that includes
a second demultiplexer that demultiplexes the third serial data stream into second parallel data steam;
a decoder that decodes the second parallel data stream into third parallel data stream based on the error correcting codes; and
a second multiplexer that multiplexes the third parallel data stream into fourth serial data stream, and outputs the fourth serial data stream; and
a second optical transmitter that converts the fourth serial data stream into third optical signals.

24. The optical transmission system according to claim 23, wherein
the second optical receiver performs soft decision process.

25. A method of error correction multiplexing transmission comprising:
demultiplexing first serial data stream into first parallel data stream constituting a matrix wherein the matrix includes a data area, an overload area containing maintenance and operation information, a fixed stuff area which contains overflow data and a row direction redundant area which contains error correcting code in the column direction and a column direction redundant area which contains error correcting code in the row direction;
calculating a first error correcting code from data in a first direction of the matrix;
adding the first error correcting code to the first parallel data stream;
calculating a second error correcting code from data in a second direction of the matrix;
adding the second error correcting code to the first parallel data stream; and
multiplexing the first parallel data stream into second serial data stream.

26. The method according to claim 25, wherein
the demultiplexing includes
demultiplexing the first serial data stream into n parallel data stream; and
demultiplexing the n parallel data stream into n×(m−i) parallel data stream, where n, m, and i are positive integers, and m is larger than i,
the calculating and adding include converting the n×(m−i) parallel data stream into n×m parallel data stream, and
the multiplexing includes
multiplexing the n×m parallel data stream to n parallel data stream; and
multiplexing the n parallel data stream into the second serial data stream.

27. The method according to claim 25, wherein
the demultiplexing includes
demultiplexing the first serial data stream into n parallel data stream; and
demultiplexing the n parallel data stream into n×m parallel data stream, where n and m are positive integers,
the calculating and adding include converting the n×m parallel data stream to n×(m+i) parallel data stream, where i is a positive integer, and m is larger than i, and
the multiplexing includes
multiplexing the n×(m+i) parallel data stream to n parallel data stream; and
multiplexing the n parallel data stream into the second serial data stream.

28. The method according to claim 25, wherein
the first direction is a column direction of the matrix, and the second direction is a row direction of the matrix.

29. The method according to claim 28, wherein
the adding the first error correcting code includes adding the first error correcting code to a predetermined row at an end of the column direction; and the adding the second error correcting code includes adding the second error correcting code to a predetermined column at an end of the row direction.

30. The method according to claim 25, wherein the first correcting code and the second correcting code differ in code format.

31. The method according to claim 25, wherein the first correcting code and the second correcting code are block codes.

32. The method according to claim 25, wherein the first correcting code and the second correcting code have same type of block code format, with different error correction codes.

33. The method according to claim 32, wherein the first parallel data stream includes
   an information area;
   an overhead information area that is added to a top of row direction of the information area to form a column of the matrix; and
   a fixed stuff area to ensure a size of the matrix, and
the method further comprises assigning overhead information in the fixed stuff area.

34. The method according to claim 25, further comprising
demultiplexing the second serial data stream into second parallel data stream constituting a matrix;
extracting a first error correcting code from the second parallel data stream; decoding data in a third direction of the matrix, wherein the third direction corresponds to the first error correcting code;
extracting a second error correcting code from the second parallel data stream; and
decoding data in a fourth direction of the matrix, wherein the fourth direction corresponds to the second error correcting code.

35. The method according to claim 34, wherein the decoding in the fourth direction is performed by using a result of the decoding in the third direction.

36. The method according to claim 35, wherein the demultiplexing includes demultiplexing third parallel data stream that is quantized into a plurality of bits by soft decision process,
the decoding includes decoding data by soft decision decoding, and
the decoding in the fourth direction is performed by using a result of the decoding in the third direction.

37. The method according to claim 35, wherein the demultiplexing includes demultiplexing third parallel data stream that is quantized into a plurality of bits by soft decision process, and
the decoding in the fourth direction repeats soft decision decoding by using the result of the decoding in the third direction by predetermined number of times of repetition.

38. A method of error correction multiplexing transmission comprising:
   demultiplexing first serial data stream into first parallel data stream constituting a matrix;
   calculating a first error correcting code from data in a first direction of the matrix:
   adding the first error correcting code to the first parallel data stream;
   calculating a second error correcting code from data in a second direction of the matrix;
   adding the second error correcting code to the first parallel data stream; and
   multiplexing the first parallel data stream into second serial data stream.
   wherein the first direction is a diagonal direction of the matrix, and the second direction is a row direction of the matrix.

39. The method according to claim 38, wherein
the adding the first error correcting code includes adding the first error correcting code to a predetermined row at an end of a column direction of the matrix, and
the adding the second error correcting code includes adding the second error correcting code to a row adjacent to an end of the row assigned with the first error correcting code.

40. The method according to claim 38, wherein
the calculating the second error correcting code includes calculating the second error correcting code from data including the first correcting code.

* * * * *